(12) United States Patent
Baars et al.

(10) Patent No.: US 10,347,543 B2
(45) Date of Patent: Jul. 9, 2019

(54) FDSOI SEMICONDUCTOR DEVICE WITH CONTACT ENHANCEMENT LAYER AND METHOD OF MANUFACTURING

(71) Applicant: GLOBALFOUNDRIES Inc., Grand Cayman (KY)

(72) Inventors: Peter Baars, Dresden (DE); Rick Carter, Saratoga Springs, NY (US); Vikrant Chauhan, Cohoes, NY (US); George Jonathan Kluth, Saratoga Springs, NY (US); Anurag Mittal, San Jose, CA (US); David Pritchard, Glenville, NY (US); Mahbub Rashed, Cupertino, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/810,557

(22) Filed: Nov. 13, 2017

(65) Prior Publication Data

US 2019/0148245 A1 May 16, 2019

(51) Int. Cl.
*H01L 21/8238* (2006.01)
*H01L 27/092* (2006.01)
(Continued)

(52) U.S. Cl.
CPC ............. *H01L 21/823871* (2013.01); *H01L 21/823814* (2013.01); *H01L 21/823878* (2013.01); *H01L 27/0922* (2013.01); *H01L 27/1207* (2013.01); *H01L 29/41783* (2013.01); *H01L 29/4941* (2013.01); *H01L 2924/0002* (2013.01)

(58) Field of Classification Search
CPC ..... H01L 21/823871; H01L 21/823814; H01L 21/823878; H01L 27/0922; H01L 27/1207; H01L 29/41783; H01L 29/4941; H01L 2924/0002
See application file for complete search history.

(56) References Cited

U.S. PATENT DOCUMENTS 5,920,098 A  7/1999  Liaw
7,166,532 B2  1/2007  Chun
(Continued)

*Primary Examiner* — Sitaramarao S Yechuri
(74) *Attorney, Agent, or Firm* — Amerson Law Firm, PLLC

(57) ABSTRACT

A method of forming contacts includes forming a plurality of transistor devices separated by shallow trench insulator regions, the transistor devices each comprising a semiconductor substrate, a buried insulator layer on the semiconductor bulk substrate, a semiconductor layer on the buried insulator layer, a high-k metal gate stack on the semiconductor layer and a gate electrode above the high-k metal gate stack, raised source/drain regions on the semiconductor layer, and a silicide contact layer above the raised source/drain regions and the gate electrode, providing an interlayer dielectric stack on the silicide contact layer and planarizing the interlayer dielectric stack, patterning a plurality of contacts through the interlayer dielectric stack onto the raised source/drain regions, and, for at least some of the contacts, patterning laterally extended contact regions above the contacts, the laterally extended contact regions extending over shallow trench insulator regions neighboring the corresponding raised source/drain regions.

19 Claims, 26 Drawing Sheets

(51) Int. Cl.
    *H01L 29/417*     (2006.01)
    *H01L 27/12*     (2006.01)
    *H01L 29/49*     (2006.01)

(56) References Cited

U.S. PATENT DOCUMENTS

| | | | | |
|---|---|---|---|---|
| 9,437,694 | B1* | 9/2016 | Gaumer | H01L 29/41783 |
| 2002/0030278 | A1* | 3/2002 | Weber | H01L 21/76829 |
| | | | | 257/758 |
| 2002/0102790 | A1* | 8/2002 | Kim | H01L 27/105 |
| | | | | 438/239 |
| 2008/0203450 | A1* | 8/2008 | Naruse | H01L 21/76807 |
| | | | | 257/290 |
| 2009/0075480 | A1* | 3/2009 | Matz | H01L 21/76834 |
| | | | | 438/694 |
| 2014/0035000 | A1* | 2/2014 | Ontalus | H01L 29/665 |
| | | | | 257/192 |
| 2015/0155353 | A1* | 6/2015 | Fan | H01L 21/84 |
| | | | | 257/347 |
| 2015/0228586 | A1* | 8/2015 | Usami | H01L 23/53238 |
| | | | | 257/751 |
| 2015/0294984 | A1* | 10/2015 | Cheng | H01L 27/1203 |
| | | | | 257/347 |
| 2016/0013133 | A1* | 1/2016 | Gu | H01L 23/53257 |
| | | | | 257/758 |
| 2016/0329280 | A1* | 11/2016 | Ma | H01L 21/76816 |
| 2016/0351448 | A1* | 12/2016 | Chen | H01L 21/76897 |
| 2018/0069000 | A1* | 3/2018 | Bergendahl | H01L 27/0886 |

* cited by examiner

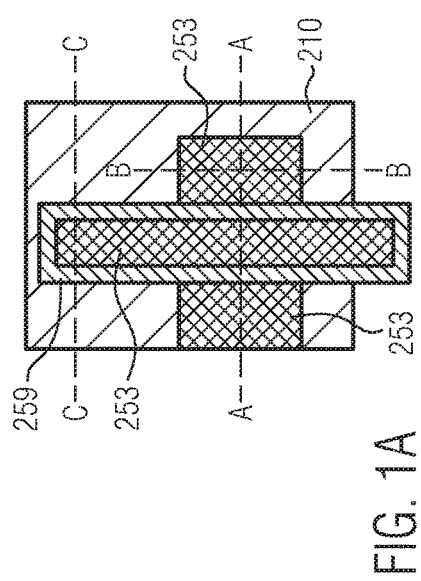
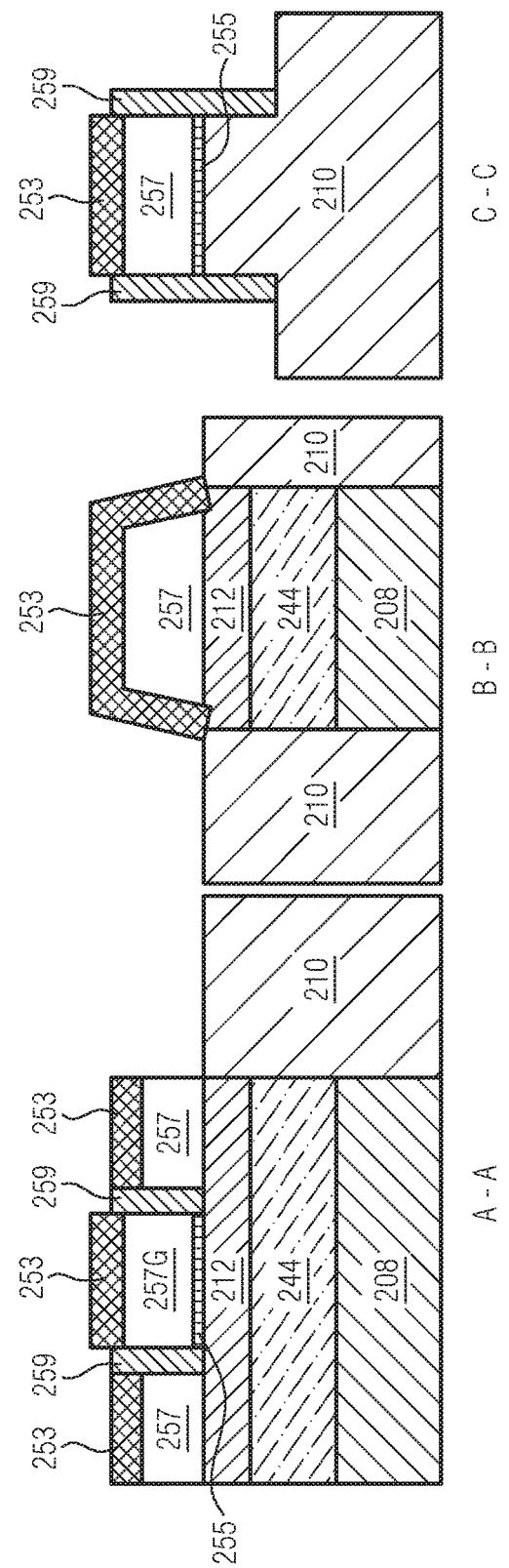
FIG. 1A
FIG. 1B

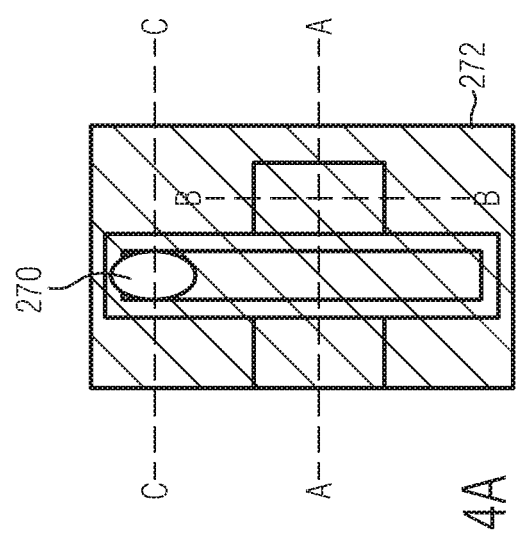

FDSOI SEMICONDUCTOR DEVICE WITH CONTACT ENHANCEMENT LAYER AND METHOD OF MANUFACTURING

BACKGROUND

1. Field of the Disclosure

Generally, the present disclosure relates to the forming of contacts during manufacturing of integrated circuits and semiconductor devices, and, more particularly, to forming contacts in a middle of the line scheme of semiconductor manufacturing, that is, after front end of line processing of transistor devices and before processing multiple metal interconnect layers.

2. Description of the Related Art

The fabrication of advanced integrated circuits, such as CPUs, storage devices, application specific integrated circuits (ASICs) and the like, requires the formation of a large number of circuit elements on a given chip area according to a specified circuit layout. In a wide variety of electronic circuits, field effect transistors represent one important type of circuit element that substantially determines performance of the integrated circuits. Generally, a plurality of process technologies are currently practiced for forming field effect transistors (FETs), wherein, for many types of complex circuitry, metal-oxide-semiconductor (MOS) technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. Miniaturization and increase of circuit densities represent ongoing demands.

A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed between the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length is a dominant design criterion for accomplishing an increase in the operating speed of the integrated circuits. As the channel length is reduced, the thickness of the gate dielectric is also reduced. The scaling of the gate dielectric is limited by several factors, such as defects, power supply voltage, time-dependent dielectric breakdown and leakage currents.

In particular, for fully depleted silicon-on-insulator (FDSOI) technology for 22 nm design of gate length and for next generation FDSOI technology for 14 nm design of gate length and expectedly for even smaller nodes of process steps, problems arise for contacting source and drain regions, since contact areas of source and drain regions tend to become smaller and smaller. In FDSOI technology, transistors are formed on a very thin epitaxial semiconductor layer over an oxide layer, requiring that source and drain regions are raised over the thin semiconductor layer. Via contacts to the raised source and drain areas need to be carefully aligned and should be even smaller in size than the respective raised source/drain areas. Contact areas crossing boundaries from raised source/drain regions to shallow trench insulator (STI) regions are effectively forbidden since etch processes for forming the contact vias show a considerable probability of producing divots in the shallow trench insulator regions if the contact overlaps an STI boundary. Divots refer to the phenomenon that top corners of field oxide regions may be removed by etching, thereby leaving voids or divots, prone to high field leakage. That is, the divots are typically located adjacent to the raised source/drain regions and may produce a considerable probability of creating punch-through defects when any high field contact area is near.

In view of the above, the present disclosure provides an alternative approach. The present disclosure is targeted on FDSOI transistors utilizing raised source/drain epitaxy processes to form the source and drain regions by out-diffusion.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally the subject matter disclosed herein relates to semiconductor devices and methods for manufacturing semiconductor devices wherein enhanced transistor performance may be obtained for N-channel transistors and P-channel transistors on the basis of Fully Depleted Silicon-on-Insulator (FDSOI) techniques.

The present disclosure provides a method of forming contacts in a middle of line scheme of semiconductor manufacturing, the method including forming a plurality of transistor devices separated by shallow trench insulator regions, the transistor devices each comprising a substrate, a buried insulator (e.g., oxide) layer positioned on the substrate, a semiconductor layer positioned on the buried oxide layer, a high-k metal gate stack positioned on the semiconductor layer, a gate electrode positioned above the high-k metal gate stack, raised source and drain regions positioned on the semiconductor layer laterally aside from the gate electrode, respectively, and a silicide source/drain contact layer positioned above the raised source and drain regions, forming an interlayer dielectric stack on the silicide source/drain contact layer and planarizing the interlayer dielectric stack, forming contact openings through the interlayer dielectric stack contacting the silicide source/drain contact layers, and, for at least some of the contact openings, forming upper lateral extensions, wherein the upper lateral extensions of the contact openings extend over shallow trench insulator regions neighboring the corresponding raised source/drain regions.

Further, the present disclosure provides a semiconductor device including a plurality of transistor devices separated by shallow trench insulator regions, the transistor devices each comprising a substrate, a buried insulator (e.g., oxide) layer positioned on the substrate, a semiconductor layer positioned on the buried oxide layer, a high-k metal gate stack positioned on the semiconductor layer and a gate electrode positioned above the high-k metal gate stack, raised source and drain regions on the semiconductor layer and laterally aside from the gate electrode, respectively, and a silicide source/drain contact layer positioned above the raised source and drain regions, an interlayer dielectric stack provided on the silicide source/drain contact layer, and contact vias in the interlayer dielectric stack contacting the silicide source/drain contact layer, wherein at least one of the contact vias comprises an upper lateral extension extending over a shallow trench insulator region neighboring the corresponding raised source/drain regions.

In a further illustrative embodiment, the present disclosure provides a method including forming a power rail spine above a trench isolation region adjacent to an active region of a semiconductor device and at least a portion of a contact connecting to one of a drain region and a source region of a transistor device in a common process sequence. Moreover, the method includes forming a lateral contact extension region extending above a portion of the trench isolation region so as to connect the contact to the power rail spine.

BRIEF DESCRIPTION OF THE DRAWINGS

The disclosure may be understood by reference to the following description taken in conjunction with the accompanying drawings, in which like reference numerals identify like elements, and in which:

FIGS. 1A-11A and 12 schematically illustrate in top views and FIGS. 1B-11B and 12 schematically illustrate in cross-sectional views, respectively, steps of process flows for forming contacts in a middle of line scheme of semiconductor manufacturing. In particular:

FIGS. 1A and 1B illustrate different views of a process flow step for manufacturing a semiconductor device after front end of line CMOS patterning;

FIGS. 4A and 4B illustrate a further step of the process flow comprising initiating forming a via contacting the gate electrode;

FIGS. 11A and 11B illustrate connecting copper lines to the trench regions of the vias; and FIG. 12 illustrates another example showing local interconnects between two raised source drain regions;

Figure 2A:
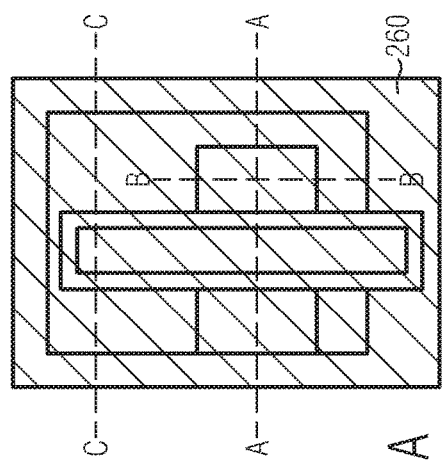
FIGS. 2A and 2B illustrate a further step of the process flow providing an etch stop layer.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios and numerical properties of ingredients, reaction conditions and so forth used in the specification and claims are to be understood as being modified in all instances by the term "about."

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make use of the disclosure. It is to be understood that other embodiments would be evident, based on the present disclosure, and that system, structure, process or mechanical changes may be made without departing from the scope of the present disclosure. In the following description, numerous specific details are given to provide a thorough understanding of the disclosure. However, it would be apparent that the embodiments of the disclosure may be practiced without the specific details. In order to avoid obscuring the present disclosure, some well-known circuits, system configurations, structure configurations and process steps are not disclosed in detail.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As used herein, spatial references "top," "bottom," "upper," "lower," "vertical," "horizontal" and the like may be used for convenience when referring to structures of field effect transistor (FET) devices. These references are intended to be used in a manner consistent with the drawings only for teaching purposes, and are not intended as absolute references for FET structures. For example, FETs may be oriented spatially in any manner different from the orientations shown in the drawings. "Vertical" is used to refer to a direction normal to the semiconductor layer surface, and "horizontal" is used to refer to a direction parallel to the semiconductor layer surface when referring to the drawings. "Upper" is used to refer to a vertical direction away from the semiconductor layer. An element positioned "above" ("below") another one is located farther away from (closer to) the semiconductor layer surface as compared to the other one.

As will be readily apparent to those skilled in the art upon a complete reading of the present application, the present method is applicable to a variety of technologies, for example, NMOS, PMOS, CMOS, etc., and is readily applicable to a variety of devices, including, but not limited to, logic devices, memory devices, SRAM devices, etc., in principle. The techniques and technologies described herein may be utilized to fabricate MOS integrated circuit devices, including NMOS integrated circuit devices, PMOS integrated circuit devices and CMOS integrated circuit devices. In particular, the process steps described herein are utilized in conjunction with any semiconductor device fabrication process that forms gate structures for integrated circuits, including both planar and non-planar integrated circuits. Although the term "MOS" properly refers to a device having a metal gate electrode and an oxide gate insulator, that term is used throughout to refer to any semiconductor device that includes a conductive gate electrode (whether metal or other conductive material) that is positioned over a gate insulator (whether oxide or other insulator) which, in turn, is positioned over a semiconductor substrate.

Typically, metal gate CMOS transistors are developed for low-voltage applications, such as processors and system on chip devices. But these devices are connected to the outside world and require input/output transistors that support higher bias voltages. A core logic or standard (single) gate (SG) logic device may typically have an IO voltage of about 1.0 V. The standard gate (SG) device oxide typically may have thickness values $T_{OX}$ (thickness of oxide) of around 16-24 Å (1.6-2.4 nm). A device for higher IO voltages, such as 2.5 V, named as ZG devices, has higher thickness values of the gate oxide $T_{OX}$, typically with thickness values of around 35-65 Å (3.5-6.5 nm).

In particular, for practical reasons, a process flow according to the present disclosure may include forming more than one semiconductor device at a time.

In the following, FIGS. 1A-11A show top views of various steps of a process flow of forming a semiconductor device. FIGS. 1B-11B each show three cross-sectional views along cut lines A-A, B-B, C-C as are indicated in the corresponding FIGS. 1A-11B. It should be understood that FIGS. 1A-11A, as well as FIGS. 1B-11B, are not drawn to scale.

FIG. 1A illustrates a process flow step for manufacturing a semiconductor device. FIG. 1A discloses a top view of a state of manufacturing a semiconductor device towards the end of front end of line patterning. The details of FIG. 1A should be viewed together with FIG. 1B. FIG. 1B discloses a silicon-on-insulator substrate comprising a semiconductor bulk substrate 208. A buried insulator (e.g., oxide) layer (BOX) 244 is provided on the semiconductor bulk substrate 208. FIG. 1B further discloses a semiconductor layer 212 on the buried oxide layer 244. The semiconductor layer 212 typically may be a fully depleted semiconductor layer (FD-SOI). The layer 212 atop of the BOX 244 may also be referred to as SOI or simply as channel region. Usually, the layer 212 is a thin layer so as to provide a thin semiconductor channel, such as a crystalline Si channel, such as a silicon/germanium channel and the like. To this end, in illustrative embodiments, the semiconductor layer 212 is appropriately configured to provide a fully depleted channel region (not shown), thereby requiring certain constraints in terms of doping and layer thickness for a given material composition of the semiconductor layer 212. In particular, the semiconductor layer 212 may have a thickness of 15 nm or even less. FIG. 1B furthers illustrates a high-k metal gate stack 255 on the semiconductor layer 212 and a gate electrode 257G atop the high-k metal gate stack 255. The high-k metal gate stack may comprise or consist of hafnium oxide followed by a metal-containing layer like a titanium nitride (TiN) layer (not shown) atop of the high-k materials, such as hafnium oxide. The term high-k or high-k dielectric refers to a material with a high dielectric constant k as compared to silicon dioxide (having k~3.9) or oxynitride (having k<6). As an example, $HfO_2$ has a dielectric constant of about 25. Further disclosed are raised source/drain regions 257 atop the semiconductor layer 212. Thus, the raised source/drain regions 257 are provided to the left and to the right side of the gate electrode 257G, respectively. The raised source/drain regions are epitaxially provided. The gate electrode/gate conductor 257G may be comprised of polymorphous or amorphous silicon. FIG. 1B further discloses spacers or separators 259 adjacent to the gate electrode 257G. The spacers separate the raised source/drain regions 257 from the gate electrode 257G. FIG. 1B further discloses a metal-containing contact layer 253, such as a silicided layer, on the gate electrode 257G and on the raised source drain regions 257, respectively. The contact layer 253 may comprise nickel, platinum, cobalt and the like, for example, the layer 253 may comprise nickel silicide (NiSi).

In the top view of FIG. 1A, essentially the regions 257 and 257G covered by the silicided contact layer 253 are visible. Also, the spacers 259 which separate the regions 257 and 257G are visible. Also, the shallow trench insulator regions 210 are visible.

FIGS. 1A and 1B may be considered as illustrating a stage of a process flow essentially at the end of a front end of line scheme. In other words, the front end of line CMOS patterning as shown in FIGS. 1A and 1B may be considered as being finished up to the silicided contact layer 253, i.e., NiSi module.

Figure 2B:
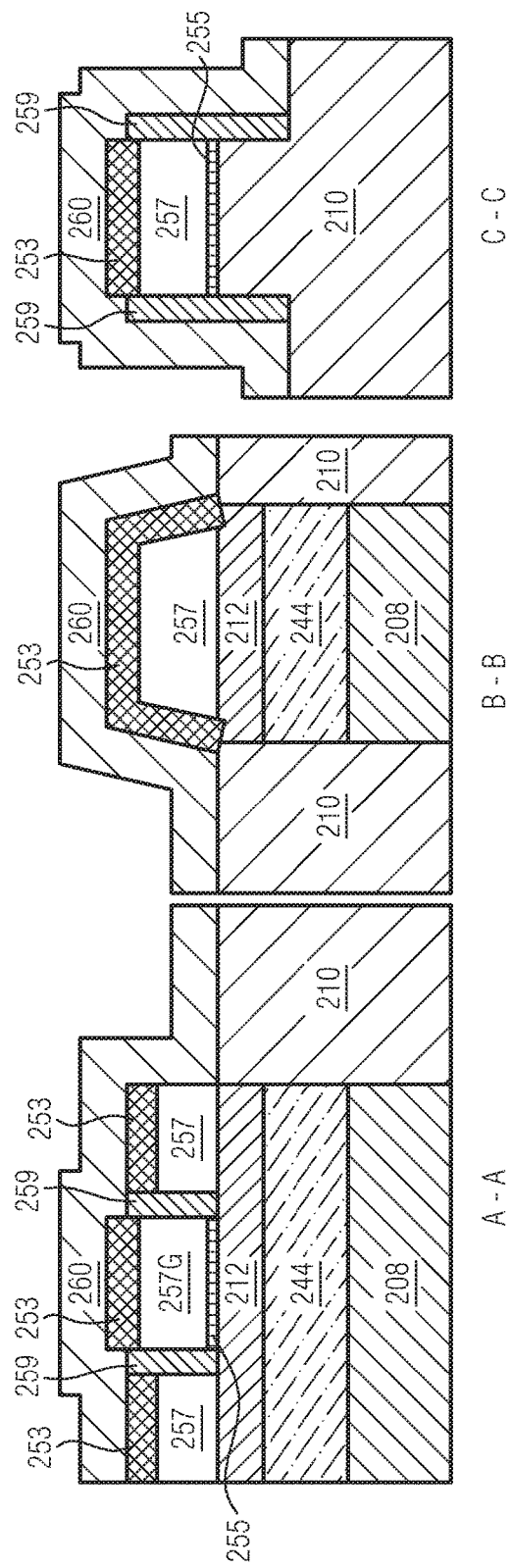

FIGS. 2A and 2B illustrate further steps of the process flow. In FIGS. 2A and 2B, the structure of FIGS. 1A and 1B has been covered by a dielectric material layer, such as a silicon nitride layer 260. The layer 260 may be deposited on the structure of FIGS. 1A and 1B and may thus act as an etch stop material, possibly additionally transferring strain into the semiconductor layer 212. The layer 260 may be formed by a plasma enhanced chemical vapor deposition (CVD) process. Thus, in one illustrative embodiment, the layer 260 comprises or consists of silicon nitride (Si3N4). The layer 260 may serve as an etch stop layer in a subsequent etching process.

Figure 3A:
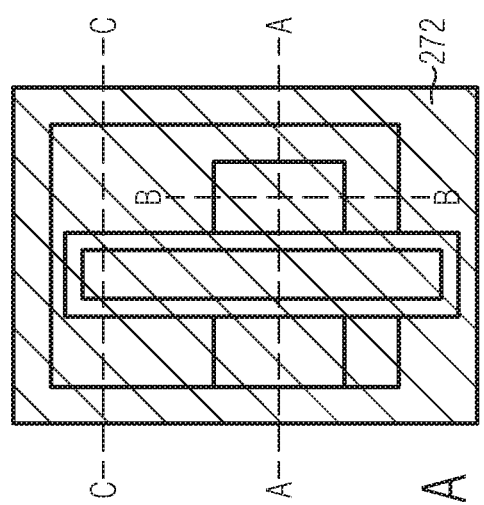
FIGS. 3A and 3B illustrate a further step of the process flow building up an initial sequence of layers for a first lithography and etching sequence of the middle of line process.
Figure 3B:
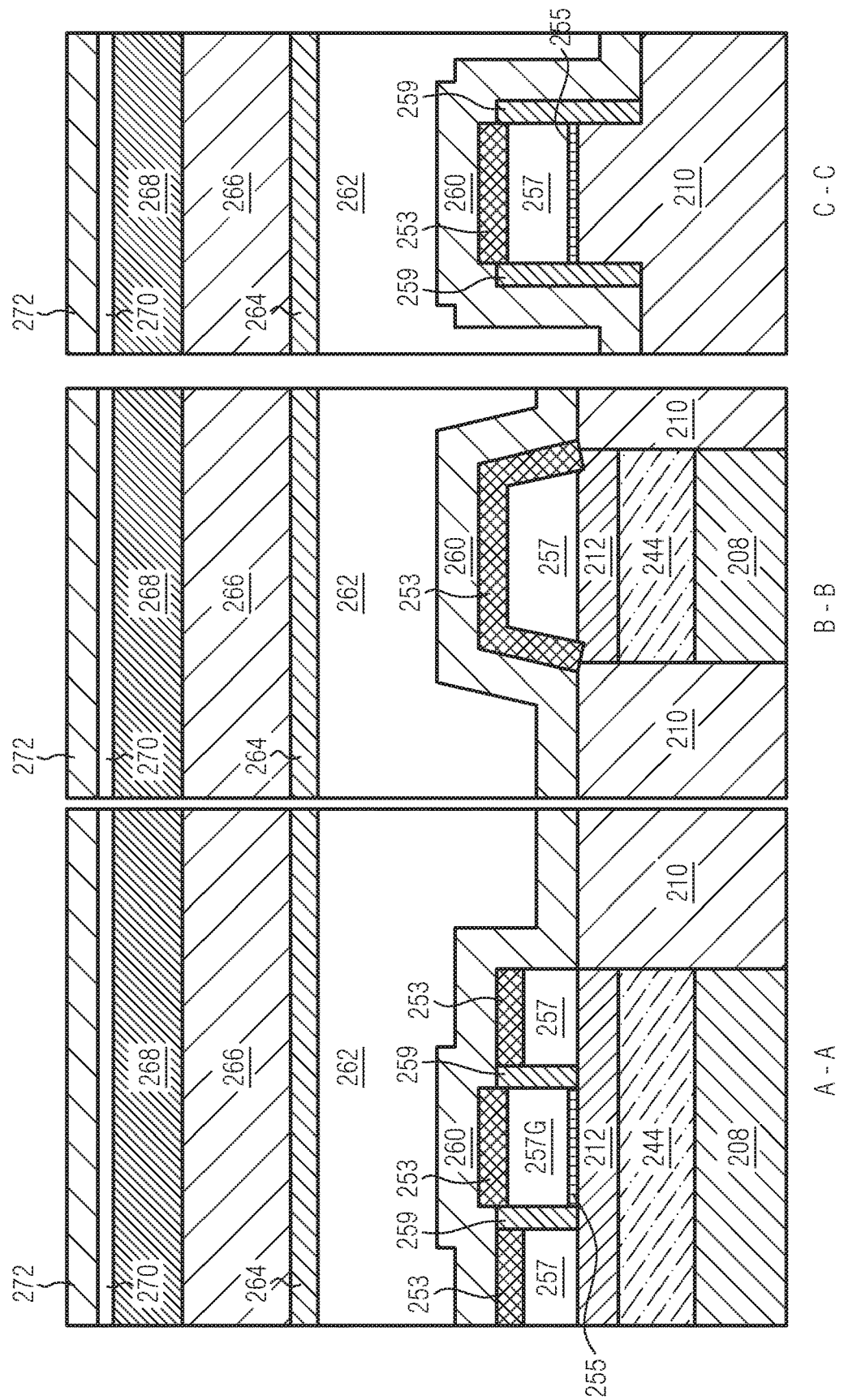

FIGS. 3A and 3B illustrate further steps of the process flow. FIG. 3B illustrates an interlayer dielectric stack on the nitride layer 260. The interlayer dielectric stack comprises a first interlayer dielectric material 262 on the nitride layer 260. The dielectric material 262 may be a silicon oxide layer and may be referred to as a dielectric oxide. The dielectric oxide 262 is deposited on the nitride layer 260. Further, owing to the topography, the dielectric oxide 262 is planarized using a typical planarization process, such as chemical mechanical polishing (CMP) process. Further, a stop layer 264 is formed on the dielectric material 262.

A second interlayer dielectric material, also referred to as a dielectric oxide 266, is formed on the stop layer 264. The stop layer 264 is thus sandwiched between the first interlayer dielectric oxide 262 and the second interlayer dielectric oxide 266. The stop layer 264 may comprise or consist of silicon oxynitride or silicon nitride. The thickness of the stop layer 264 may be on the order of 10 nm.

FIG. 3B further illustrates a layer 268 comprising or consisting of spin-on hard mask (SOH) of organic, polymer or carbon material. The layer 268 is provided on the second interlayer dielectric oxide 266. Further, a thin oxide layer 270 is provided on the SOH layer 268. FIGS. 3A and 3B further illustrate a mask layer or silicon nitride layer 272 which may act as a memory layer for forming contacts. It should be noted that the illustrated sequence of layers and the respective materials shown in FIG. 3B only serves as an example. The materials may also be provided starting with a nitride layer followed by an oxide layer or followed also by a layer of SiON (not shown). Any kind of material combination may be used that has enough etch selectivity against each other in order to act as a memory layer stack.

Figure 4B:
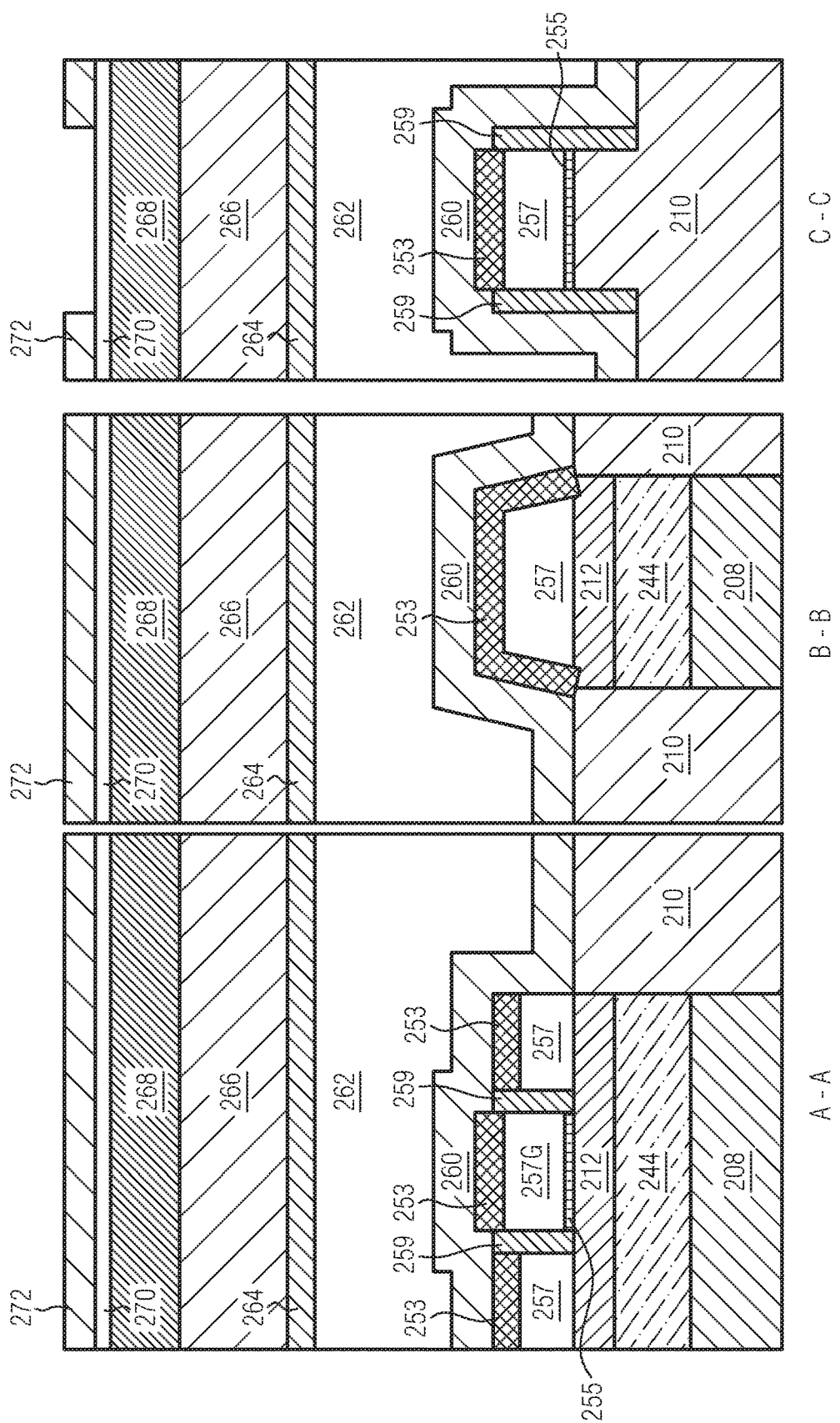

FIGS. 4A and 4B illustrate a further step of the process flow. FIGS. 4A and 4B illustrate the beginning of forming a contact to the gate contact layer, located along the C-C cross-sectional view. This gate contact is sometimes denoted by CB or CB1. FIGS. 4A and 4B schematically indicate a result of a first sequence of lithography and etching, sometimes denoted LE, by patterning the memory layer 272 and delineating an opening to expose the thin oxide layer 270. The process steps involved in the LE process are not shown here. It should be understood that forming a gate contact located along the C-C cross-sectional view as a first contact is illustrated here merely for explanatory purposes and that it is also possible to start with processing of source/drain contacts located along cross-sectional views B-B or A-A, respectively. In principle, more than one contact may be formed at a time. As will be discussed later on, openings for contacts connecting to the drain and source regions and the gate electrode may be formed in a common patterning sequence. At the end of the step shown in FIGS. 4A and 4B, the memory layer 272 has been opened at a location along the C-C direction down to the oxide layer 270.

Figure 5A:
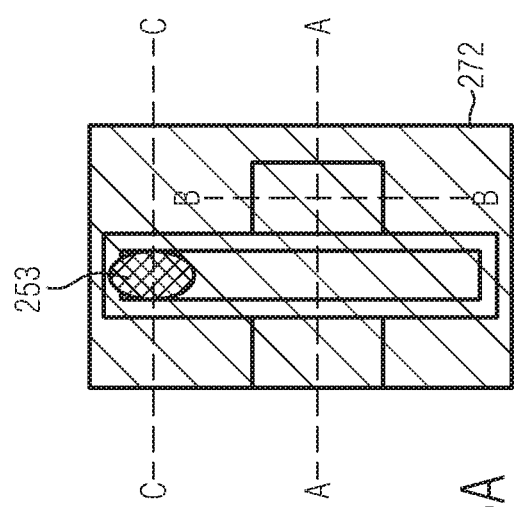
FIGS. 5A and 5B illustrate a further step of the process flow which shows the completion of forming the via contacting the gate electrode.
Figure 5B:
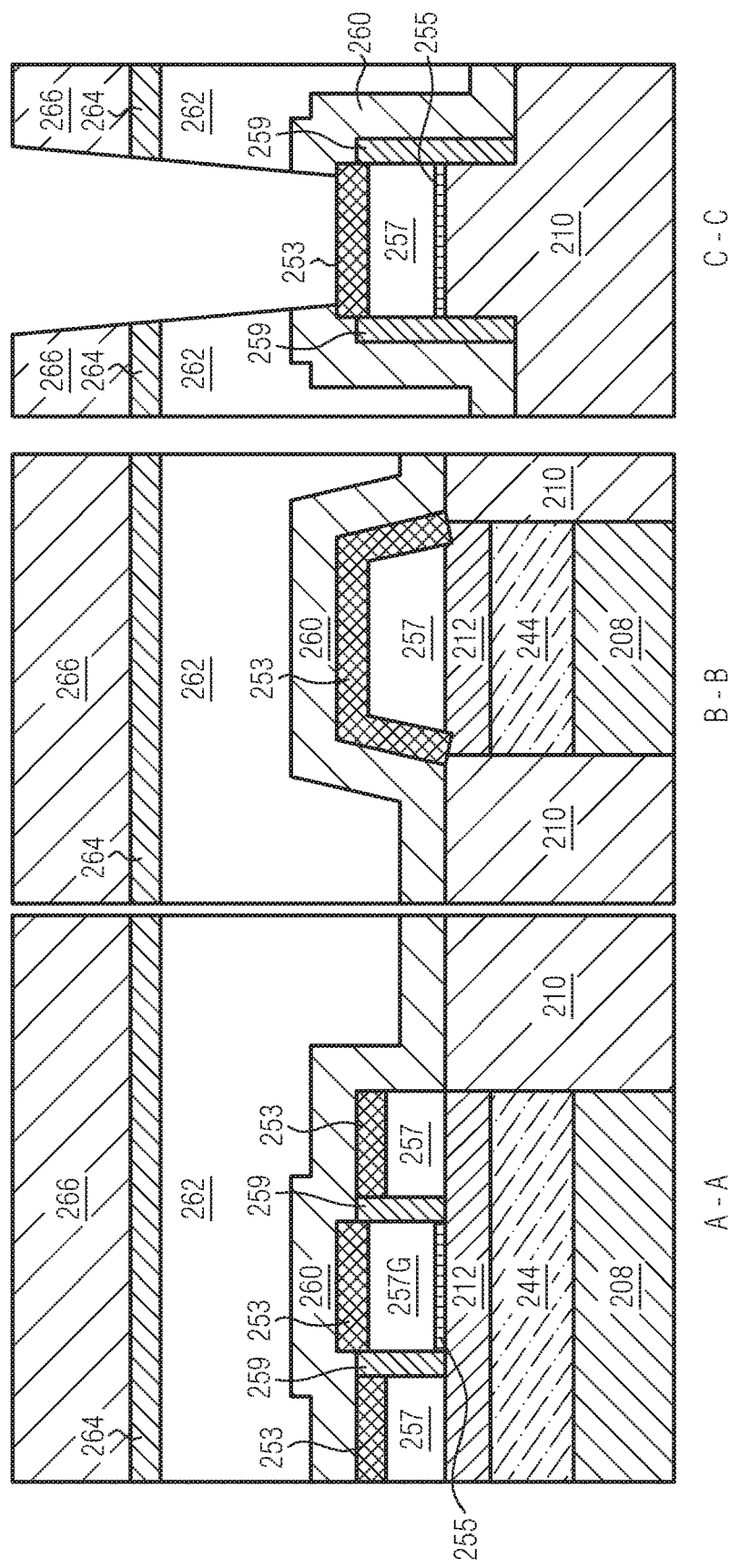

FIGS. 5A and 5B illustrate the process flow after etching the gate contact opening at the location along C-C. In FIG. 5B, it is illustrated that the etching is performed all the way down to the NiSi layer 253 acting as an etch stop for the etching of the gate contact via. That is, as illustrated in FIG. 5A, the NiSi layer 253 is exposed by performing this etching step. This may also be viewed as forming the via for contacting the gate contact layer with the CB contact in the C-C region. For the other regions, as depicted for the A-A and B-B views, only the masking layer 272, the oxide layer 270 and the SOH layer 268 are removed in this step. Thus, at the end of the step illustrated in FIGS. 5A and 5B, the via for the CB contact has been etched down to the NiSi layer 253, thereby exposing the NiSi layer 253 of the gate contact at a position over an STI lapping region 210.

Figure 6A:
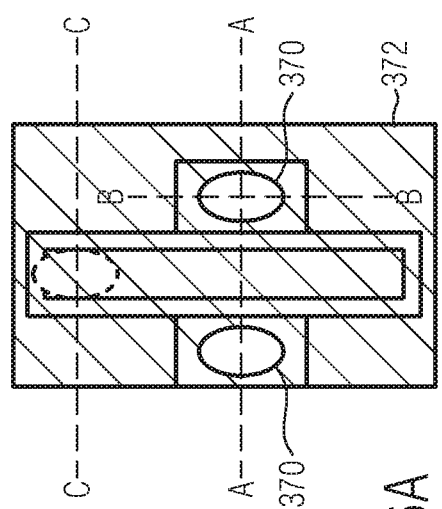
FIGS. 6A and 6B illustrate a further step of the process flow after filling the via of FIGS. 5A and 5B, building up an initial sequence of layers for a second lithography and etching sequence of the middle of line process for forming the vias contacting the source and drain contacts.
Figure 6B:
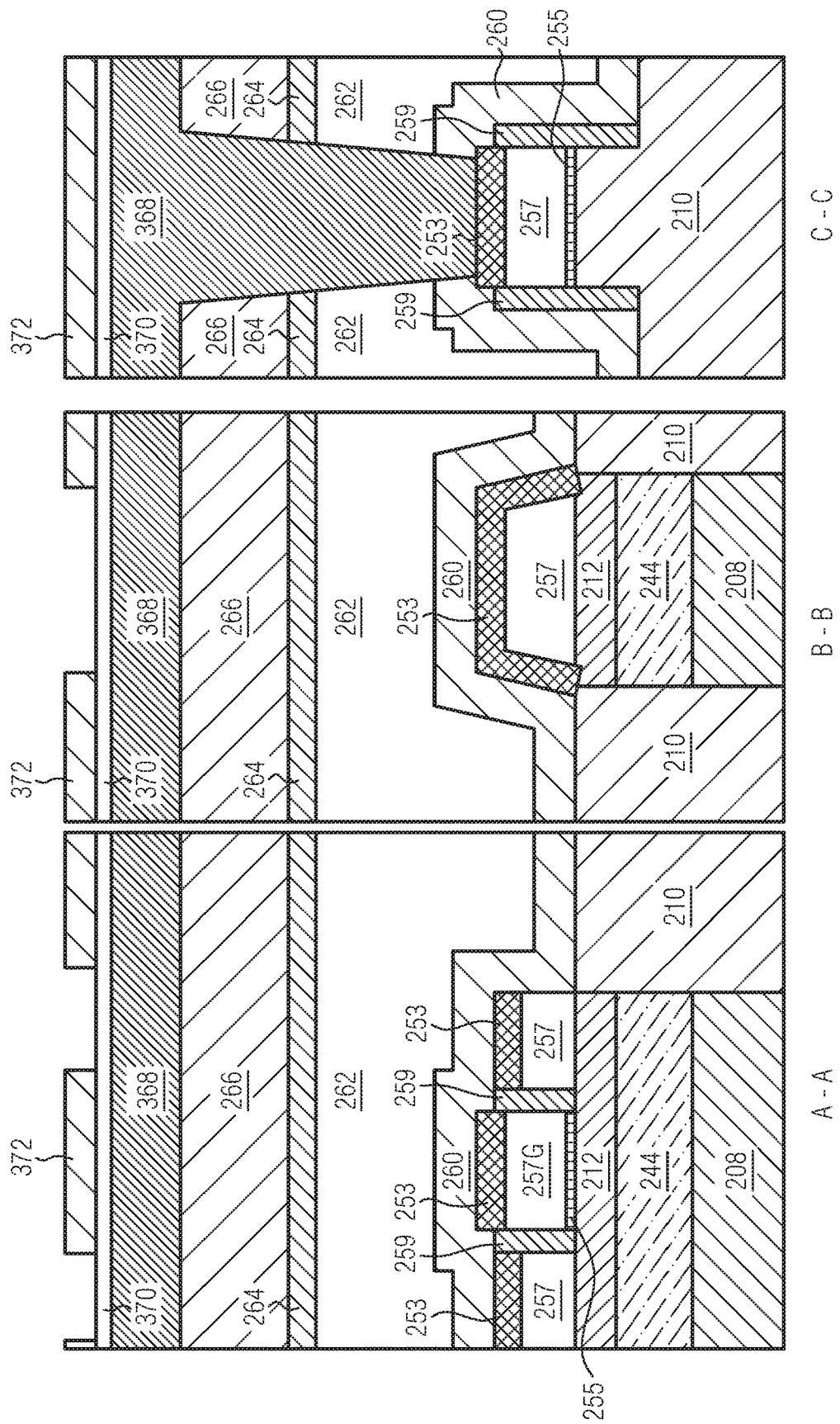

FIGS. 6A and 6B illustrate the process flow after a further intermediate step for forming the gate contact CB. The via for the CB contact as illustrated in FIG. 5B has been filled with SOH material, denoted by 368. As illustrated in FIG. 6B, a layer of the SOH material 368 covers the entire device regions as may be seen in the sectional A-A and B-B views. Also, the SOH material layer 368 is further covered by an oxide layer 370 and a masking layer 372, which may comprise or consist of silicon nitride. The sequence of layers 368, 370 and 372 thus corresponds to the sequence of layers 268, 270 and 272 as shown in FIG. 4B.

As is indicated in FIG. 6B, another sequence of lithography and etching (LE) is performed exposing the oxide layer 370 by etching through the hard mask, thereby patterning the masking layer 372 for forming the source/drain contact vias. This may be in analogy to forming the gate contact vias as shown in FIG. 4B. These source/drain contacts may also be denoted by CA1 and CA2, respectively.

Figure 7A:
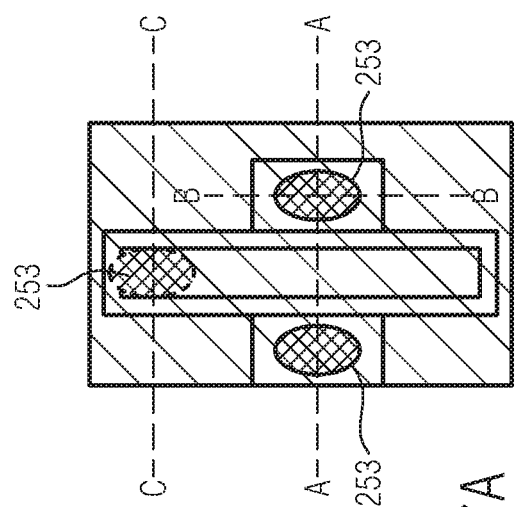
FIGS. 7A and 7B illustrate a further step of the process flow indicating completion of forming the vias contacting the source and drain contacts.
Figure 7B:
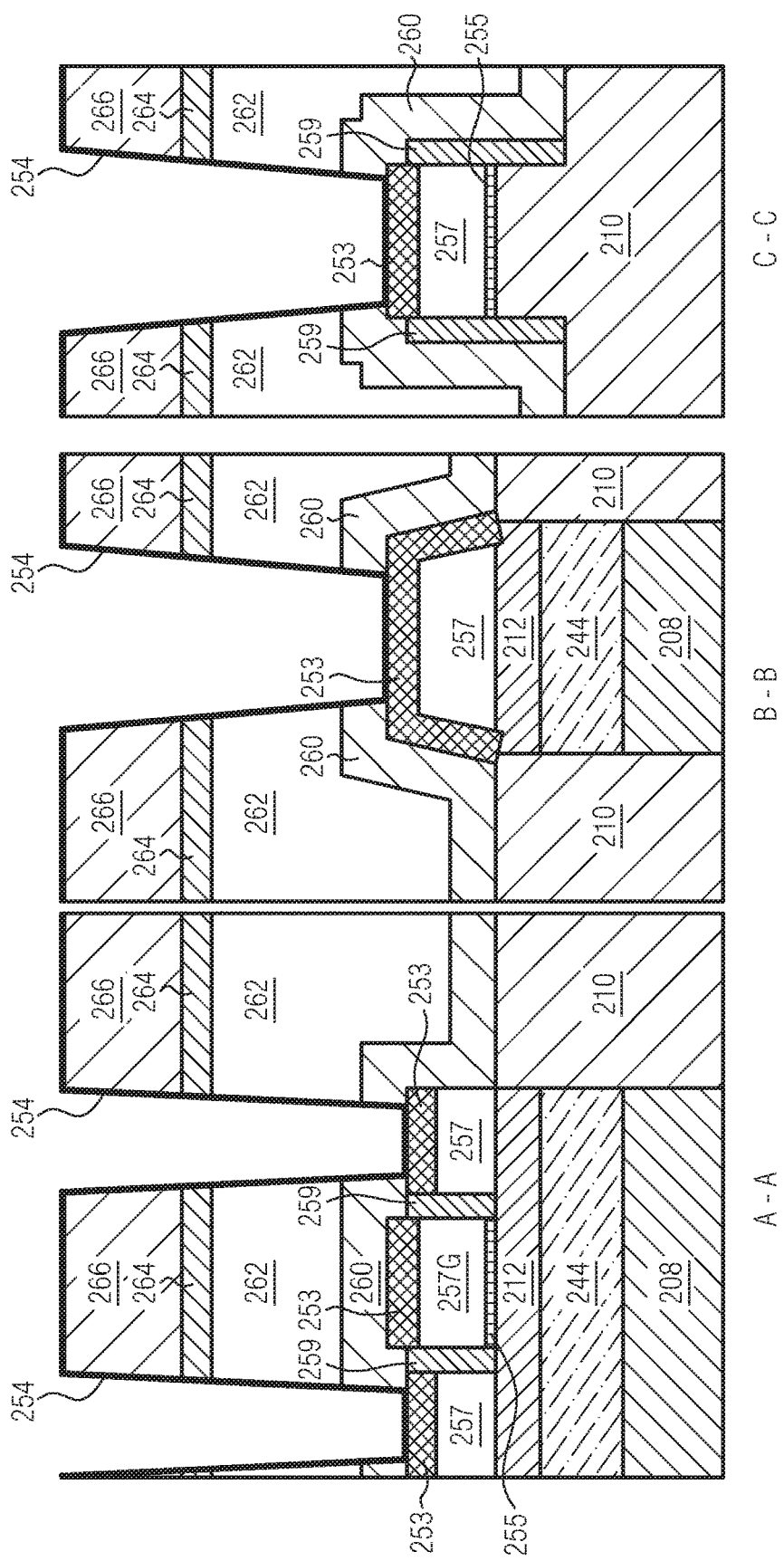

FIGS. 7A and 7B illustrate the process flow after a further etching step down to the NiSi material 253. This etching step serves to provide the vias for contacts CA1 and CA2, respectively. Thereafter, the masking layer 372 and the oxide layer 370 are stripped and the SOH material 368 is removed over the device surface and in the gate contact via CB. In a subsequent step, a thin oxide liner 254 may be deposited over the entire structure so as to provide protection of the NiSi material 253 before the next process steps are applied. The oxide liner may be applied by atomic layer deposition. As a result of the processing step illustrated in FIGS. 7A and 7B, three vias for contacting gate, source and drain are shown, each via having a thin oxide liner layer 254 deposited on its respective surface.

Figure 8A:
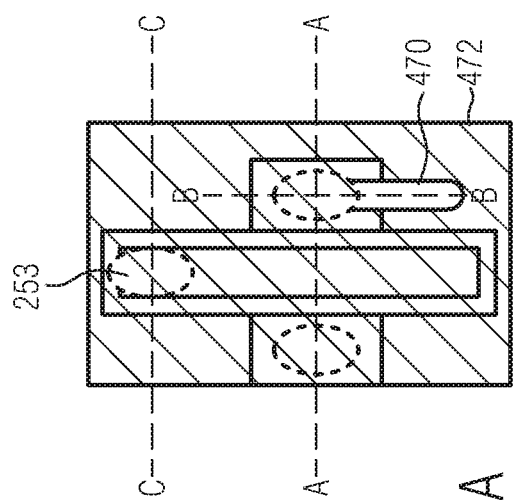
FIGS. 8A and 8B illustrate a further step of the process flow after filling the vias contacting the source and drain contacts, comprising building up an initial sequence of layers for a third lithography and etching sequence of the middle of line process.
Figure 8B:
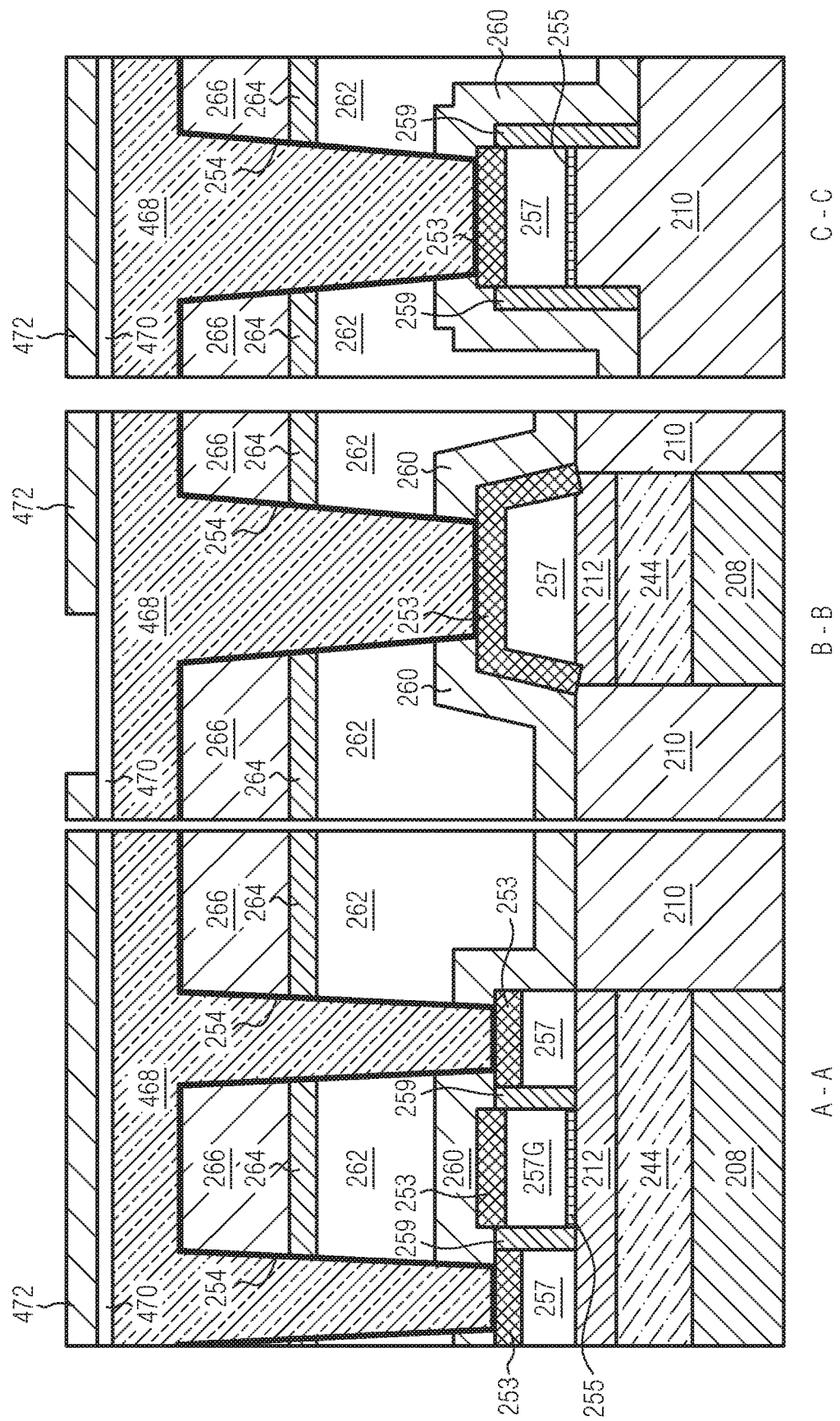

FIGS. 8A and 8B illustrate the process flow after a further step of filling all vias that are illustrated in FIGS. 7A and 7B with SOH material 468. On the SOH material 468, a thin oxide layer 470 and a masking layer 472 are deposited, in this order, in analogy to the sequence of layers 368, 370 and 372, as well as 268, 270, 272, as discussed before with regard to FIGS. 6A and 6B and 4A and 4B, respectively.

FIGS. 8A and 8B further illustrate a step of patterning the masking layer for forming a lateral contact extension located along the cross sectional view B-B. The opening having the shape of a slot formed in the masking layer 472 extends from a position over the source contact via at one side to a position overlapping the STI region 210 at the other side. Thereafter, etching of the SOH material 468 through the mask opening is performed down to the stop layer 264. Thereby, the contact via is formed having an upper lateral extension over the STI region, also called a "fly over" region.

Figure 9A:
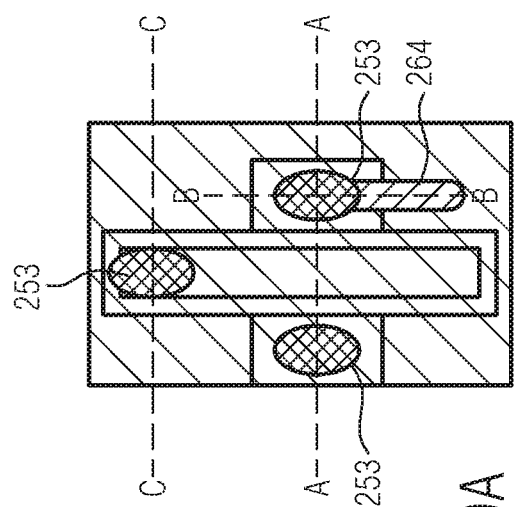
FIGS. 9A and 9B illustrate a further step of the process flow comprising patterning a trench overlapping the vias into the dielectric material.
Figure 9B:
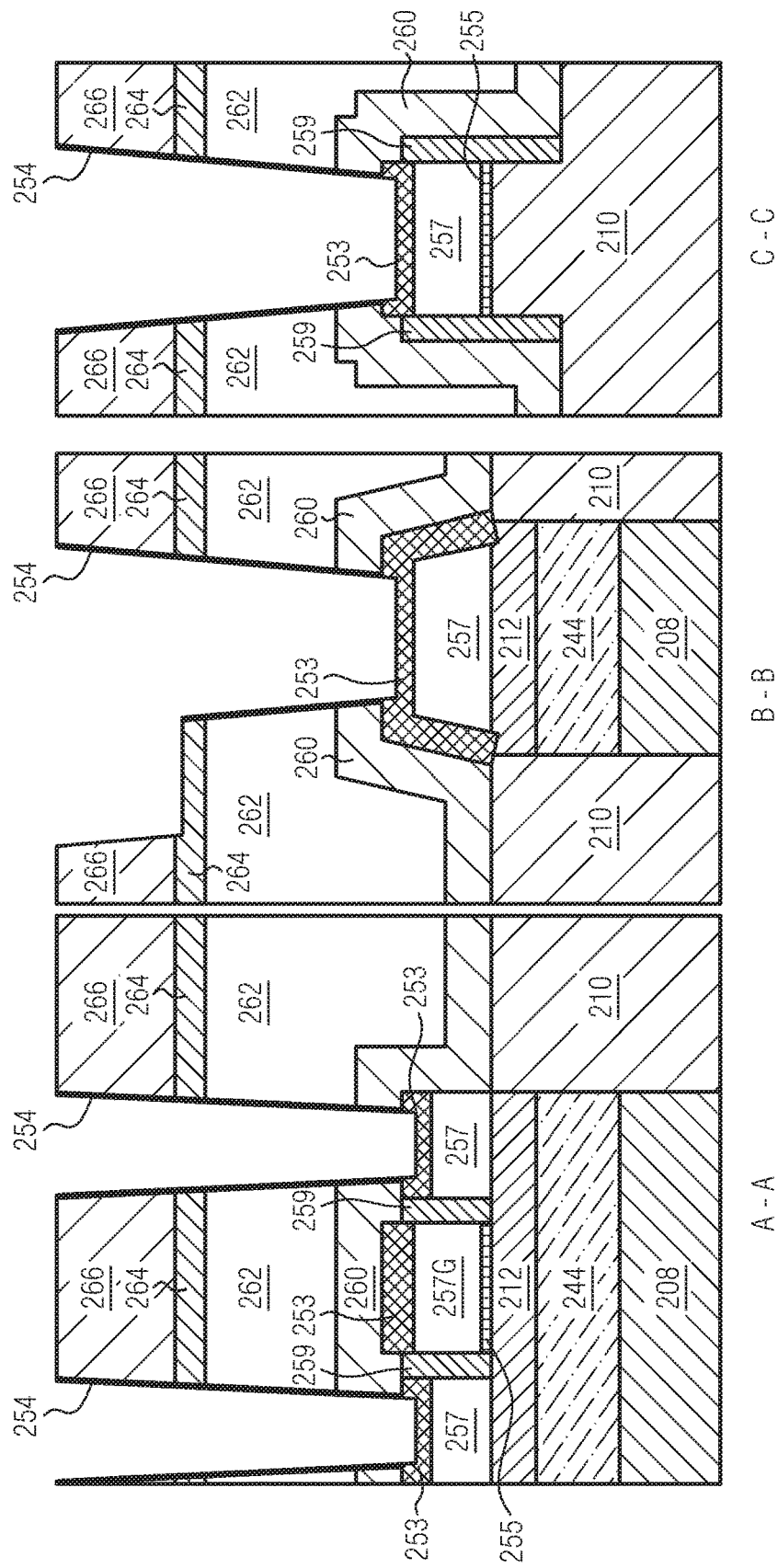

FIGS. 9A and 9B illustrate the process flow after the "fly over" region has been etched, the masking layer 472 and the oxide layer 470 have been stripped and the SOH material 468 has been removed by etching from the device surface as well as the contact vias. It should be noted that this is basically a plasma strip process, being selective to oxide as well as to nitride. In order to strip the SOH material 468, first the cover layers 472 and 470 have to be removed. Thus, a trench has been formed in the dielectric material layer 266 above the etch stop layer 264 into the interlayer dielectric stack.

Moreover, FIGS. 9A and 9B indicate that this etching step now breaks through the protective oxide liner 254 on the NiSi material, thereby exposing the NiSi material covering the gate, source and drain contact silicide layers 253. A cleaning step (not shown) may follow the etching step.

Figure 10A:
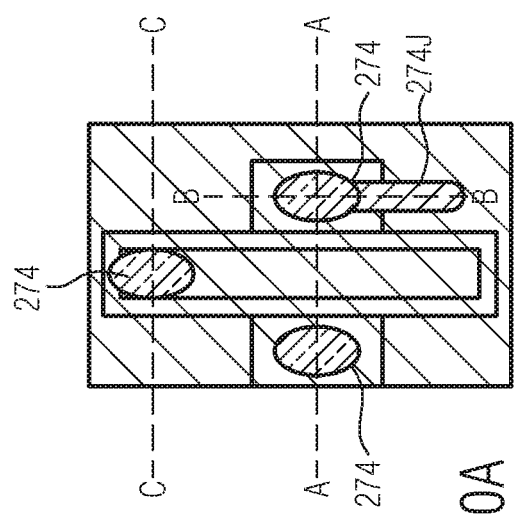
FIGS. 10A and 10B illustrate a further step of the process flow showing filling the vias with a conductive material.
Figure 10B:
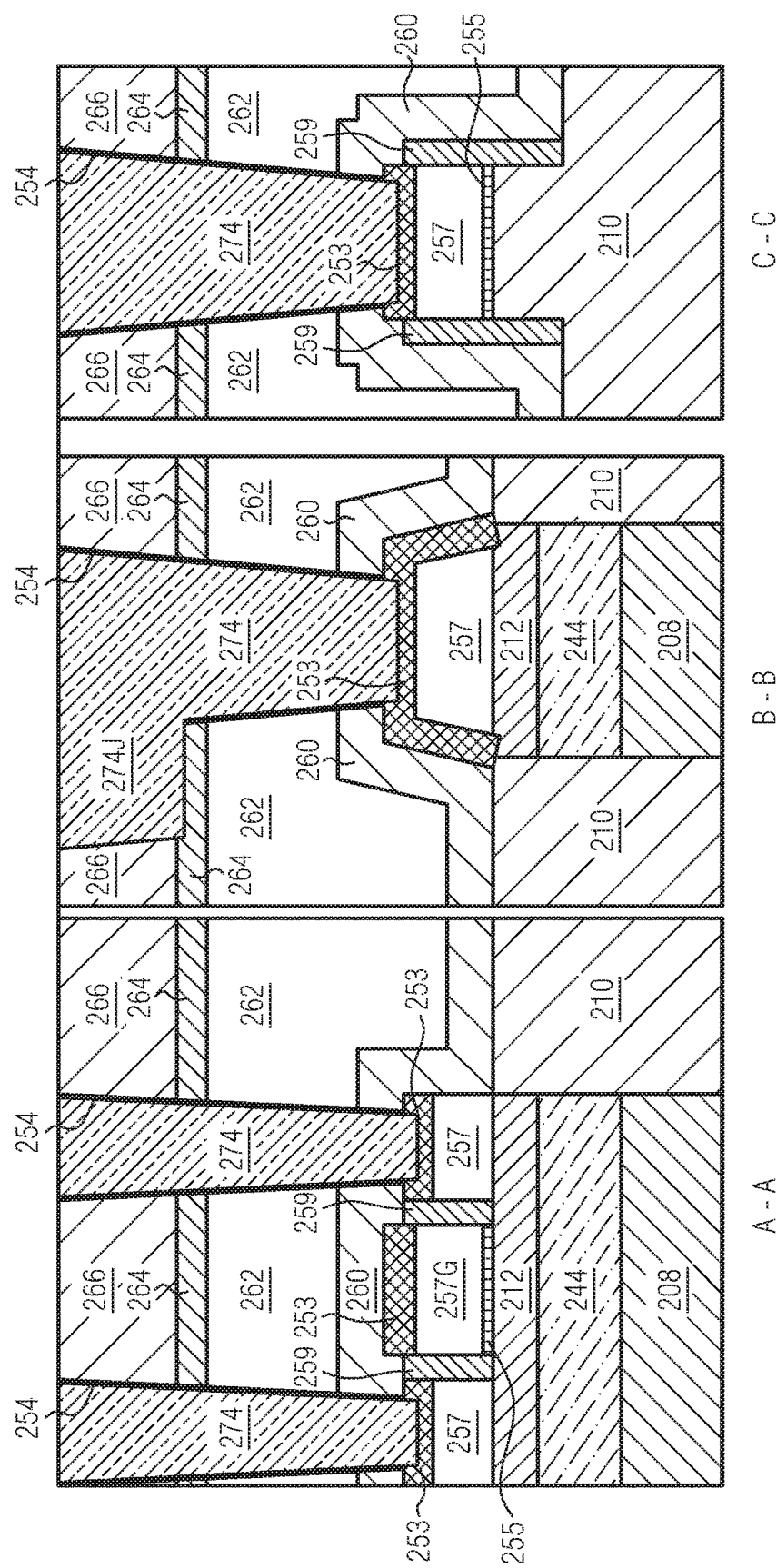

In FIGS. 10A and 10B, the device is shown after the vias for contacts CA1, CA2, and CB have been filled with a conductive material 274. This conductive material 274 may be tungsten (W). Typically, filling with tungsten is done in conjunction with providing a Ti/TiN barrier or liner in the vias (not shown). The Ti/TiN barrier may also be needed for adhesion of the W to the surface. Also, as the conductive material is filled in the vias, conductive material is at the same time also filled into the lateral extension, i.e., the trench, thereby providing conductive material 274J in the trench. This conductive material now effectively provides the "fly over" region with respect to the shallow trench insulator (STI) region 210 located underneath, but separated from the "fly over" region by at least one layer of interlayer dielectric material, here interlayer dielectric material 262. It should be understood that the structure may be planarized by a planarizing step, such as chemical and/or mechanical polishing, so as to provide an even surface at the upper side.

Figure 11A:
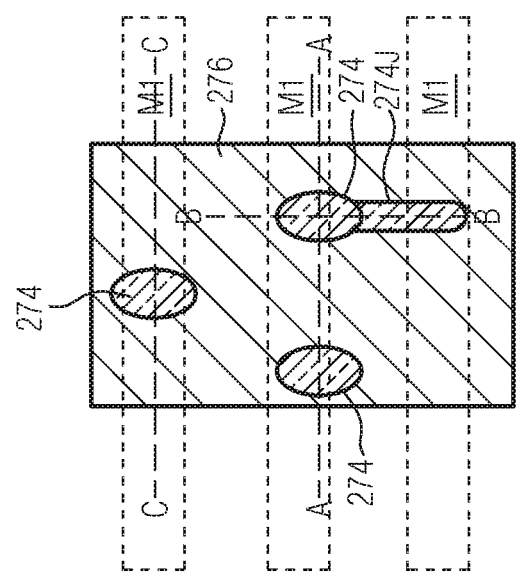
Figure 11B:
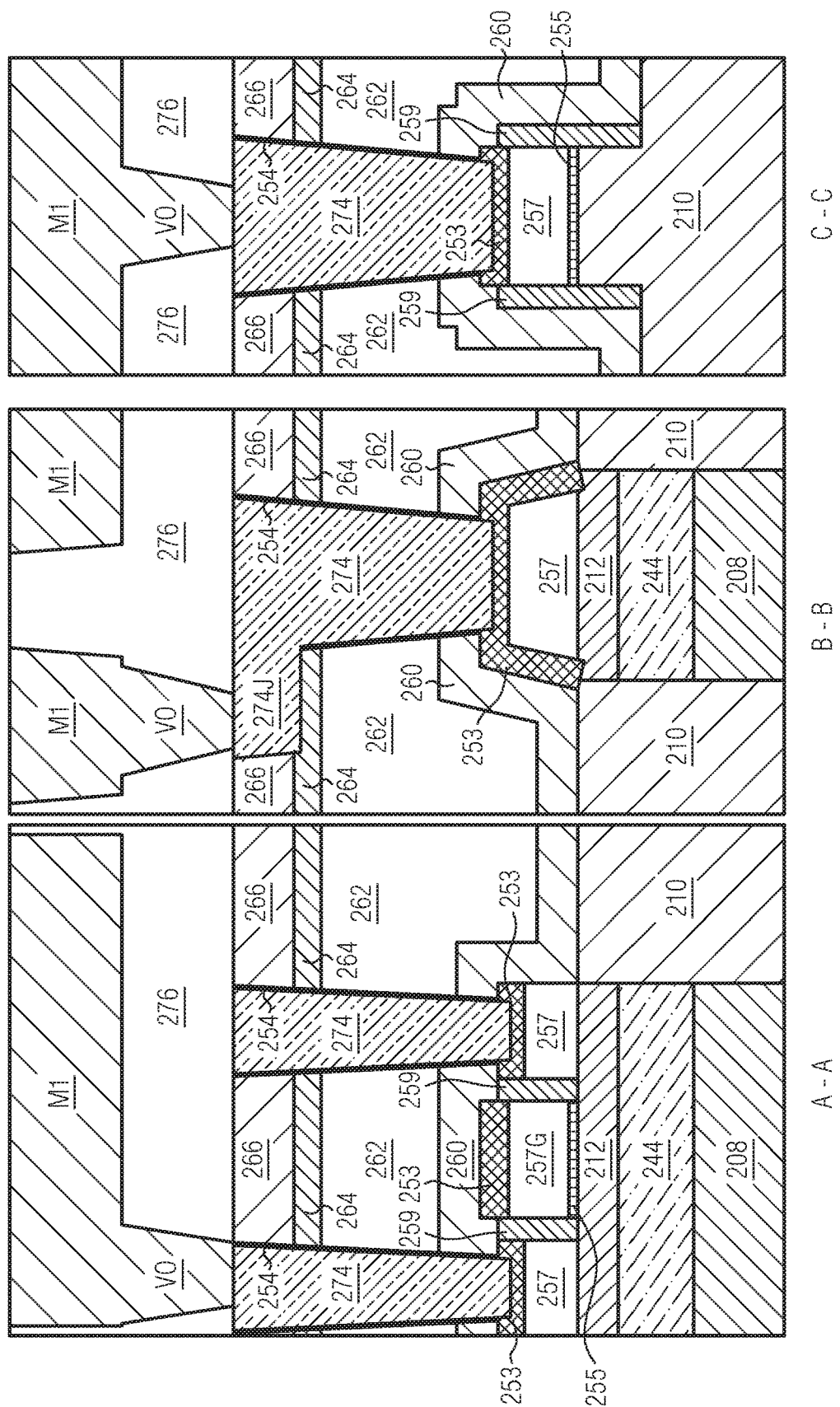

FIGS. 11A and 11B illustrate the process flow after a dielectric material 276 of a first metallization level M1, such as a silicon containing material, e.g., SiCOH, was deposited on the surface of the structure illustrated in FIGS. 10A and 10B. Further, in material 276, conducting strip lines, e.g., copper strip lines, are formed. The conducting strip lines are electrically connected to the gate, source and drain contact vias 274 by copper via V0 which connects to the conducting lines of the first metallization level M1. The copper vias V0 are provided at certain predefined positions spaced from each other and located on the contact enhancement level with contact vias 274. This is accomplished in a self-aligned way with respect to M1. Further, V0 and/or M1 may be patterned into the SiCOH material 276. The V0 vias may connect to the contacts CA1, CA2, and CB1, denoted by 274. The V0 vias connecting to the source contact vias located in region B-B of the cross-sectional view may also connect to the "fly over" regions 274J. The M1 lines connect to the V0 vias. Thereby, the "fly over" regions 274J provide large enough contact regions for contacting to power rail lines as may be provided by the V0, M1 combination.

Figure 12:
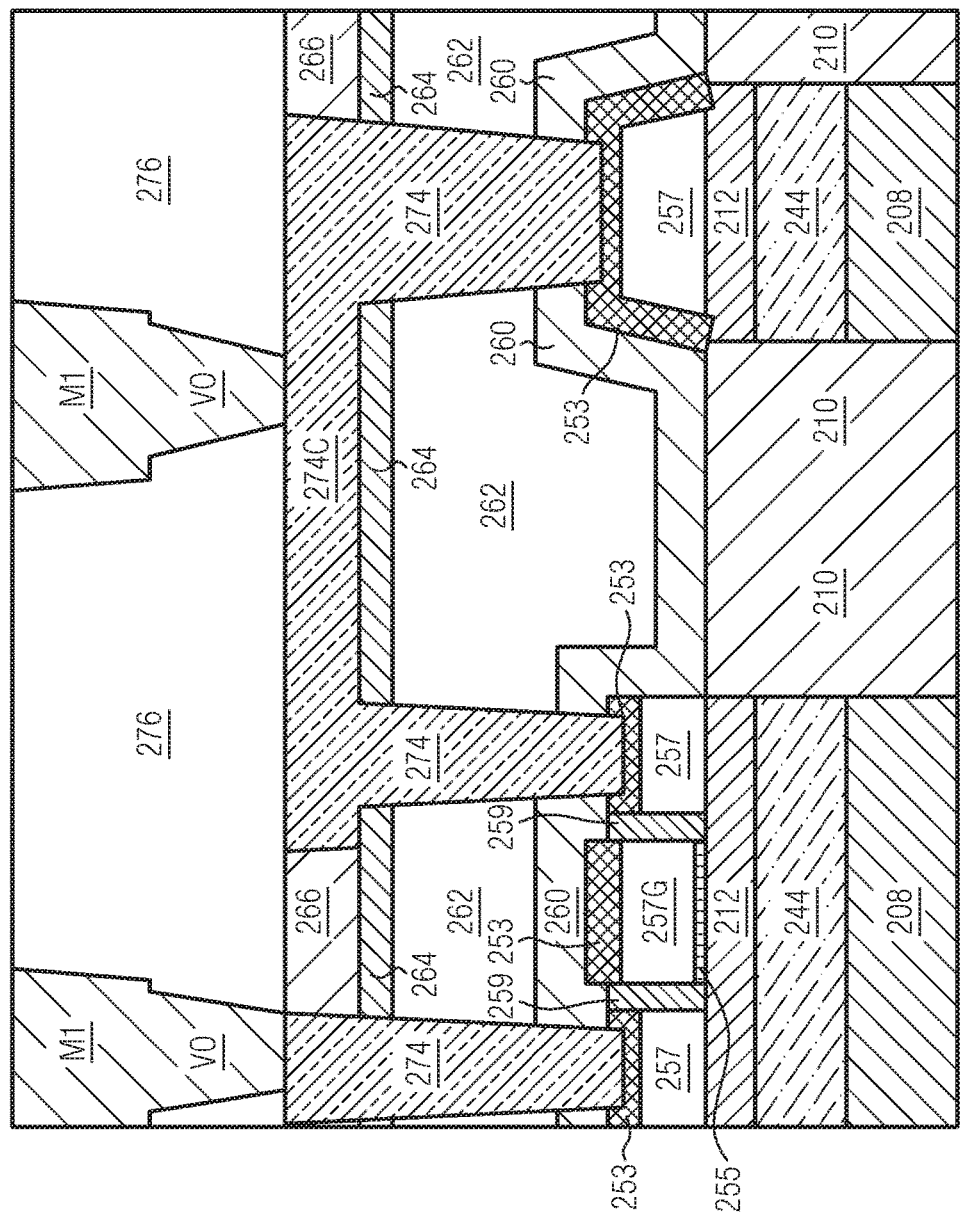

FIG. 12 illustrates that additionally or alternatively, the "fly over" regions 274J may also form local interconnects 274C between two raised source/drain regions. Thus the local interconnect 274C may also be viewed as a jumper between two neighboring source/drain regions. In addition, as indicated in FIG. 12, the jumper may also be contacted by power rail lines via V0 and M1, similarly as the contacts in FIGS. 11A and 11B.

Thus, the contact vias laterally extended over STI regions or "fly over" regions and/or local interconnects serving as jumpers provide a solution for providing a specific design configuration and thus a safe chip area for 22 nm or 14 nm or below, avoiding the need to provide any high field contacts near possible divots close to the source/drain regions.

That is, design engineers are provided with significantly increased flexibility in reducing overall dimensions in the contact level as well as in the first metallization layer M1, since even though the drain and source regions have to be contacted strictly within the active region, nevertheless the connection to the first metallization layer by the vias V0 may be implemented above the trench isolation regions. Consequently, the significant surface topography caused by the material loss in the trench isolation regions, for instance as illustrated in FIG. 1B according to the section C-C it is evident that the gate electrode running above the isolation region 210 is laterally surrounded by a recessed area of the isolation region 210, wherein a respective material loss may contribute to a recess or divot extending down to a height level that corresponds to approximately the middle of the buried insulating layer 244. Since, in existing sophisticated layouts, the area adjacent to the drain and source regions above the isolation region 210 is not available for the design engineers in routing any metal lines of the first metallization layer due to significant contact failures, the concept disclosed herein provides the possibility of reliably contacting drain and source regions while at the same time providing additional space for routing metal lines of the first metallization layer, as for instance shown in FIG. 11A, since the actual connection to the respective metal lines takes place above the isolation region.

Generally, due to the two-level contact structure, in addition to providing extra design flexibility for design engineers in developing semiconductor layouts of increased robustness and/or to providing superior process margins for process engineers due to a significantly increased tolerance with respect to misalignments and positioning and forming respective vias for connecting to the first metallization layer, additional design flexibility may be presented to design engineers with respect to further reducing critical dimension and thus increasing packing density by the principles as disclosed herein. For example, upon reducing the distance between gate electrode structures in densely packed device areas, such as cell areas for basic logic elements, such as NAND gates or inverters, from 104 nm to, for instance, 96 nm for the next generation of sophisticated semiconductor devices, it may be necessary to reduce lateral dimensions, i.e., the width thereof, of respective metal lines used for providing power to the respective circuit elements in order to meet the stringent design criteria.

Also in this respect, the two-level contact structure may contribute to superior design flexibility, as will be discussed later on in more detail. Additionally, it is to be noted that, in the embodiments described so far, certain approaches have been illustrated, in which contact openings or vias may be formed for drain and source regions and gate electrode structures in different patterning process sequences, for instance, when attempting to reduce process-related non-uniformities, in particular when etching through a plurality of dielectric materials to different height levels.

To this end, as previously discussed, the contact openings for the drain and source regions may be formed first or the contact openings connecting to the gate electrode structures may be formed first, followed by a corresponding patterning sequence for forming the other type of contact opening. In still other approaches (not shown), the contact openings of a plurality of different types, such as contact openings for drain and source regions and contact openings for gate electrode structures, may be formed in a common process sequence, thereby contributing to superior process efficiency, since several masking and lithography steps may be omitted. To this end, process strategies may be applied, in which, for example, the etch stop layer 260 (see FIG. 4B) may be preserved upon etching through the remaining layer stack of interlayer dielectric materials, thereby ensuring highly uniform process conditions upon finally etching through the etch stop layer 260 so as to expose the respective metal silicide regions 253. For example, upon forming the trench for the lateral contact extension region, a final step may be included in which the etch stop layer 260 may be removed in the corresponding contact openings, possibly in combination with also etching through the etch stop layer 264 (see FIG. 9B), which may result in increasing the depth of the corresponding trench, thereby even further contributing to superior conductivity of the resulting lateral contact extension region.

In other illustrative embodiments (not shown), the respective trench of the lateral contact extension region may be formed first, followed by a respective patterning sequence in order to etch the contact openings through the dielectric material while reliably covering the trench portion, thereby also contributing to a highly efficient overall process sequence.

With reference to FIGS. 13-18, further illustrative embodiments will now be described in more detail, in which a two-level contact structure may provide superior design flexibility, in particular with respect to further reducing overall dimensions, and, in some illustrative embodiments, with respect to reducing the dimensions of power rail spines and power rail lines.

Figure 13:
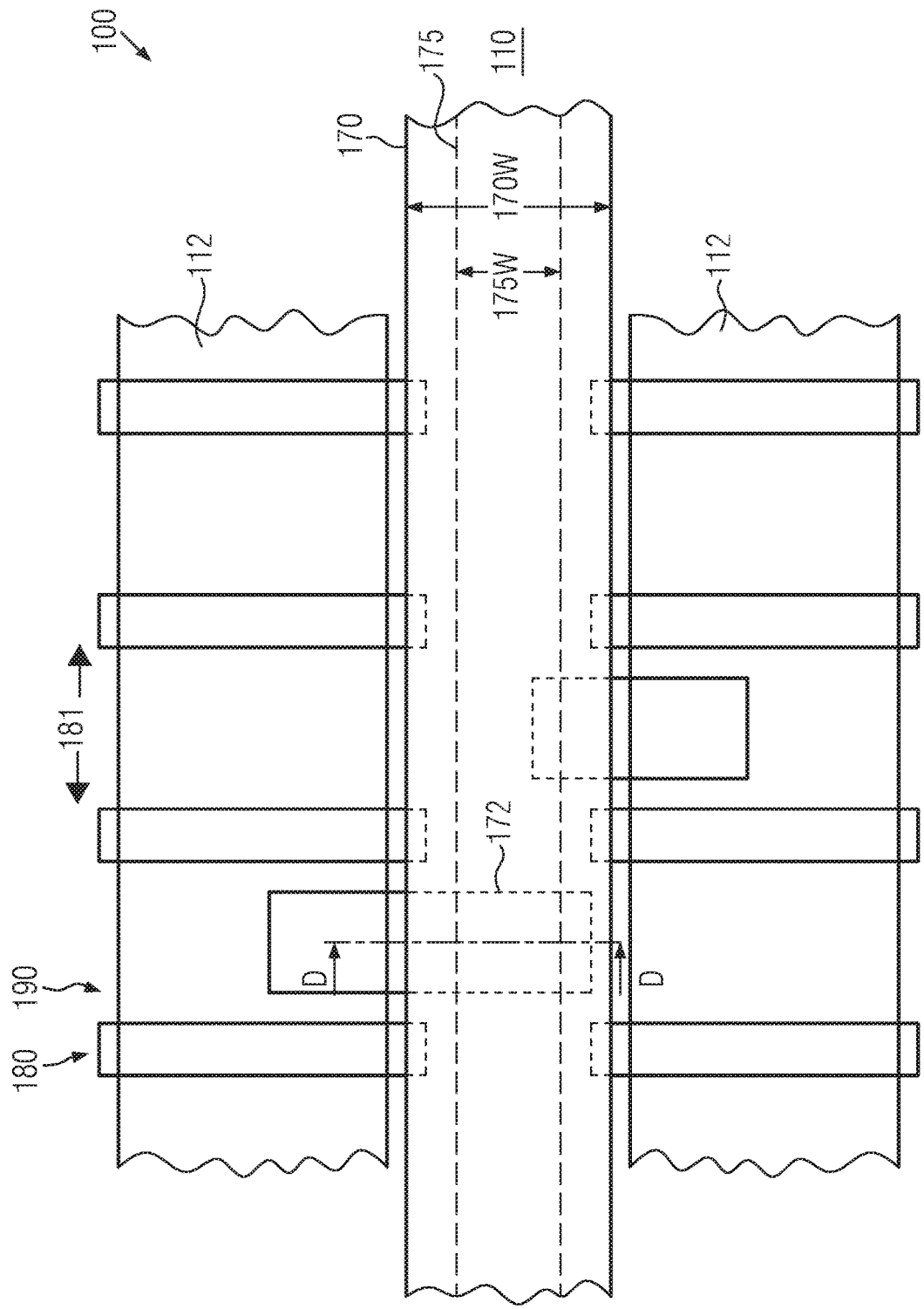
FIGS. 13 and 14 schematically illustrate top views of a semiconductor device according to still further illustrative embodiments.

FIG. 13 schematically illustrates a top view of a semiconductor device 100, which may be designed and formed on the basis of critical dimensions as also specified above in the context of FIGS. 1A-12, i.e., the semiconductor device 100 may comprise transistor elements 190 formed on the basis of a gate length of 30 nm and significantly less, wherein at least a part of these transistor elements may be formed as fully depleted SOI devices, wherein a basic semiconductor material may have a thickness of 15 nm and significantly less.

As illustrated, the semiconductor device 100 may include active regions 112, which may basically correspond to the semiconductor material, as discussed above, having appropriate thickness and configuration so as to form respective fully depleted transistor elements therein and thereon. For example, any such transistor elements, such as the transistor elements 190, may have a planar architecture as, for instance, described in more detail with reference to FIGS. 1A-12. That is, the transistor elements 190 may comprise drain and source regions (not shown), which may have a raised architecture, as previously discussed, and may also comprise gate electrode structures 180, which may have any appropriate configuration, as for instance discussed above. As illustrated, the gate electrode structures 180 may be provided in a substantially parallel manner with a specified distance or pitch 181, which is based on a specific design value corresponding to a certain technology and device configuration. For example, in highly sophisticated devices, the pitch 181 may, in certain device cells including basic logic gates, such as inverters, NAND gates and the like, or even in device areas with high packing density, such as memory areas, have a value of 104 nm, while, in other illustrative embodiments, the pitch 181 may be less than 100 nm, such as 96 nm and even less. It should be appreciated that these values are design values or target values, which may vary in actual devices due to process related non-uniformities and the like.

Basically, power and ground may be supplied to the transistor elements 190 by any appropriate wiring in a respective metallization layer, as for instance also discussed above with reference to FIG. 11A, wherein source and drain regions of the corresponding transistor elements may be connected to metal lines of the very first metallization layer by the vias V0, thereby using the lateral contact extension regions for providing the possibility of landing directly on the source and/or drain regions by means of a lower portion of the respective contact elements, while nevertheless providing contact to the metal lines of the first metallization layer above the isolation regions, as discussed above.

In many cases, the power routing may be accomplished on the basis of so-called power rails, provided in the first metallization layer, the dimensions and positions of which may have to be appropriately adapted to the overall design criteria in order to avoid short circuits due to process-related and technology-determined constraints. For example, respective logic cells including a plurality of transistor elements may be supplied by a power rail positioned adjacent to the respective active regions, such as the regions 112, wherein electric connection to the lower device level may be accomplished on the basis of respective vias, such as V0, as previously discussed, to connect to a conductive line, also referred to as power rail spine, from which appropriate connections may be routed into the corresponding transistor elements or device cells. For example, in FIG. 13, a power rail 170, that is, a metal line of the first metallization layer, may be provided so as to supply power to the adjacent active regions 112 and thus the transistor elements 190 formed therein. The power rail 170 may basically be positioned above an isolation region 110, such as a trench isolation region, as discussed above, and may have a length and a width that are adapted to the overall design criteria, as discussed before. For example, in sophisticated applications, the power rail 170 may have a width 170 W of 64 nm for a value of 104 nm of the pitch 181, wherein it should also be appreciated that this value may represent a design value which may vary in actual semiconductor devices due to process-related tolerances. In some illustrative embodiments, the width 170 W may be selected to be less than 60 nm, for instance 40 nm, due to the provision of a two-level contact structure, as will be discussed later on.

Furthermore, a power rail spine 175 may be provided below the power rail 170 and may be formed on the isolation region 110. Typically, the power rail spine 175 may have dimensions adapted to the lateral dimensions of the power rail 170 and also with respect to the resistivity of the conductive material used therein. In illustrative embodiments disclosed herein, a width 175 W of the power rail spine 175 may be less than the width 170 W; in some illustrative embodiments, the width 175 W of the power rail spine 175 may be 40 nm and less, for instance 30 nm, when, for instance, the design value of the width 170 W is selected to be 40 nm. An electrical connection between the power rail 170 and the power rail spine 175 may be accomplished by a via 172, such as V0, as previously explained.

Figure 14:
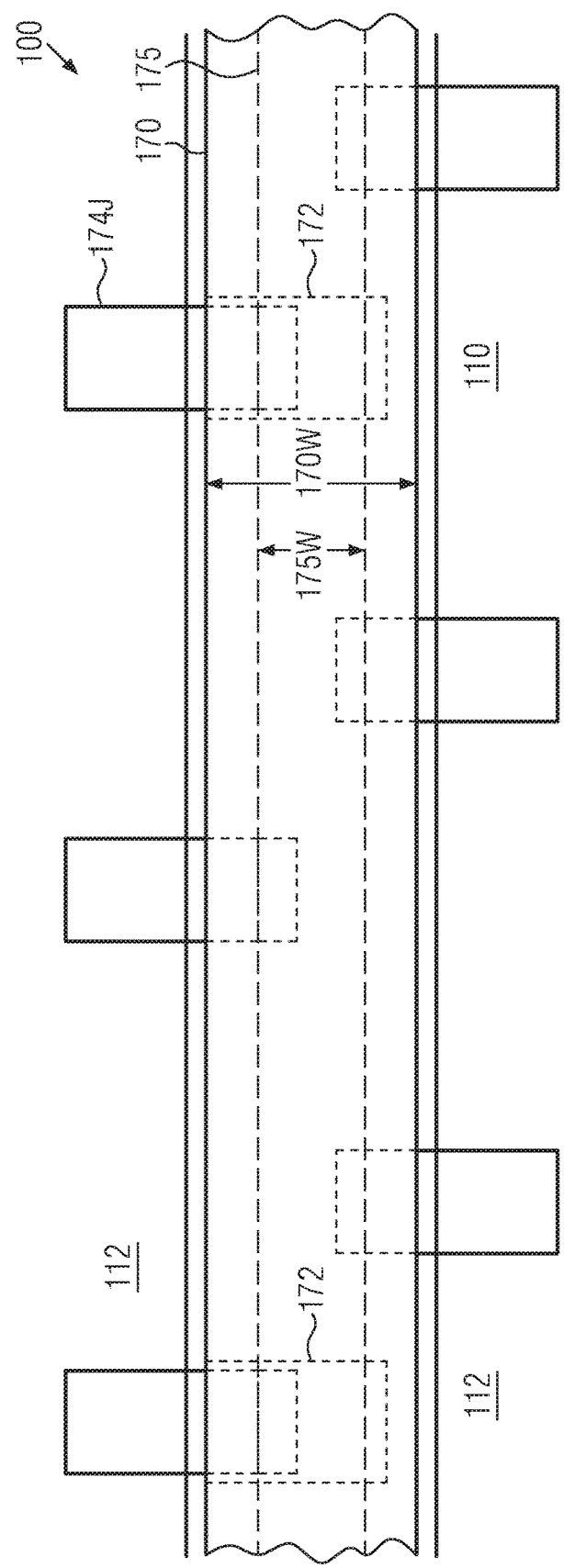

FIG. 14 schematically illustrates a top view of the semiconductor device 100, wherein the power rail 170, the power rail spine 175, the vias 172 and respective lateral contact extension regions 174J are illustrated only in combination with a portion of the isolation region 110 and the active regions 112. The lateral contact extension regions 174J may represent contact elements at a different height level compared to the power rail spine 175 and other contact elements (not shown) so as to establish electrical connection between the power rail spine 175, formed above the isolation region, and the active regions 112 without being affected by the pronounced surface topography caused by the material loss in the isolation regions 110, as previously discussed. In some illustrative embodiments, the configuration as shown in FIG. 14 may be appropriate for device scaling by selecting the design value of the width 170 W as discussed above, by selecting the width 175 W of the power rail spine 175 in the above-discussed range and by providing the vias 172 as vias centrally positioned with respect to the power rail 170. Furthermore, the vias 172 may not need to be positioned at every lateral contact extension region 174J, but may be positioned arbitrarily, even with irregular pitch, thereby providing superior design flexibility.

It should be appreciated that the semiconductor device 100 may be formed on the basis of process techniques as discussed above with reference to FIGS. 1A-12 in order to establish a two-level contact structure, wherein, in particular, the power rail spine 175 may be formed as a "contact element" of the lower level, i.e., a contact element that is equivalent to the contact elements connecting to the drain or source region and receiving a lateral extension, such as the lateral contact extension region 174J. In other illustrative embodiments, as will be discussed in more detail with reference to FIGS. 15-18, a process strategy will be described in which separate process sequences may be applied so as to form a first or lower level of contact elements, followed by a further process sequence for forming an upper level of contact elements, such as the lateral contact extension regions 174J.

Figure 15:
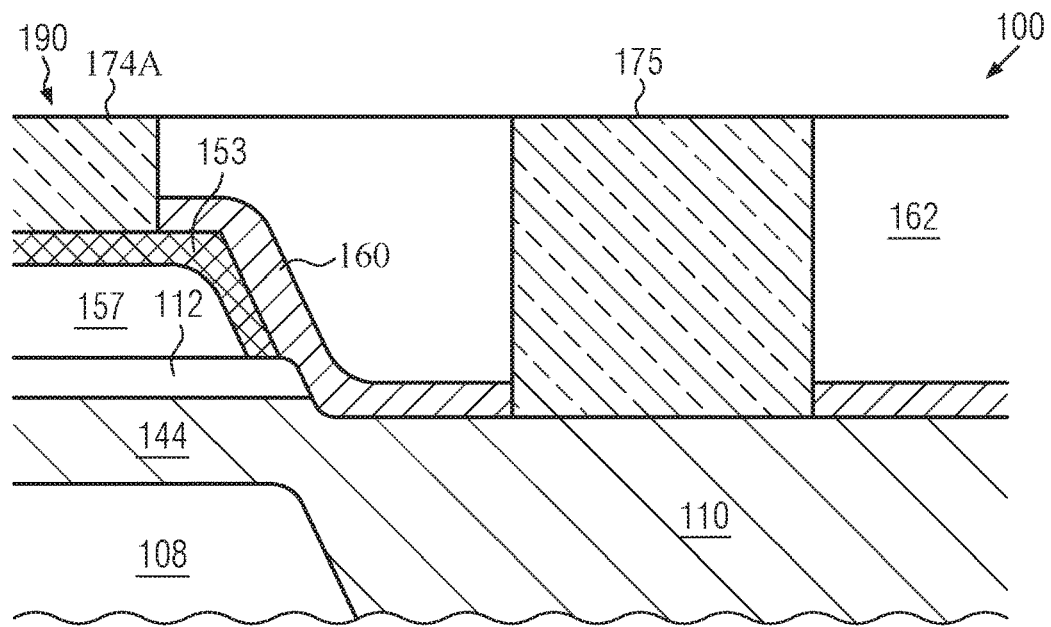
FIGS. 15-18 schematically illustrate cross-sectional views of the semiconductor device in various manufacturing stages, wherein the cross-section is taken along the line D-D of FIG. 13.

FIG. 15 schematically illustrates a cross-sectional view of the semiconductor device 100, wherein the section is taken along the line indicated by D-D in FIG. 13. As illustrated, the transistor element 190, a portion of which shown for the sake of clarity, may be formed in and above the active region or semiconductor layer 112 including a drain region 157, for instance provided in the form of a raised drain and source region, as also discussed above. Furthermore, the drain region 157 may comprise a highly conductive metal semiconductor compound, such as a nickel silicide material, a nickel/platinum silicide and the like, indicated by 153. Furthermore, as discussed above, at least some of the transistor elements 190 may be provided in the form of fully depleted SOI devices, so that a buried insulating layer 144 may be positioned below the active region or semiconductor layer 112. Consequently, the semiconductor layer 112 and any channel region (not shown) formed therein in a substantially fully depleted configuration may be isolated from a substrate 108 by the buried insulating layer 144.

Furthermore, dielectric materials 160, for instance in the form of an etch stop layer, such as a silicon nitride layer and the like, in combination with a dielectric material 162, such as silicon dioxide and the like, may be formed above the transistors 190 and the isolation region 110. It should be noted that a significant topography may be present between the active region 112 and the isolation region 110 due to material loss caused in previous processes, as also discussed above, which may conventionally contribute to very restricted design rules and may nevertheless cause significant contact failures, as also discussed above.

The power rail spine 175 may be formed above the isolation region 110 so as to be laterally embedded in the dielectric materials 160, 162. Similarly, the first portion of a contact element, indicated as 174A, may be formed above the drain region 157 and may be positioned such that any overlap with the isolation region 110 is basically avoided, as also discussed above, thereby respecting respective design rules. The contact portion 174A and the power rail spine 175 may be formed in a common process sequence, as discussed later on, and may therefore comprise the same material or materials so as to provide the desired high conductivity. For example, tungsten in combination with titanium/titanium nitride as a barrier/adhesion material (not shown) may be used, while, in other cases, any other appropriate highly conductive metal-containing materials may be used.

The semiconductor device 100 as shown in FIG. 15 may be formed on the basis of the following processes. The isolation region 110 and the semiconductor layer 112 may be formed in accordance with well-established process techniques, thereby laterally delineating the active regions (see FIG. 13) as required by design criteria. Next, the transistor elements 190 may be formed on the basis of well-established process techniques, for instance by depositing materials for gate electrode structures, forming masking layers, patterning the same by sophisticated lithography and etch techniques, followed by epitaxial growth techniques so as to form the raised drain and source regions 157. Thereafter, a metal semiconductor compound, such as the material 153, may be formed in the drain and source regions and in the respective gate electrode structures, for instance in a common process sequence or in separate process sequences when different characteristics may be considered advantageous for the drain and source regions and the gate electrode structures, depending on the overall process strategy.

Thereafter, the dielectric materials 160 and 162 may be formed by well-established deposition techniques, followed by planarization processes, as is also discussed above. Based on a substantially planarized surface topography, appropriate lithography techniques may be applied, as also discussed above, possibly including the deposition of mask materials, and the like, followed by a lithographic process and a subsequent etch process so as to form openings in the material 162. It should be appreciated that, although a more or less significant height difference between the drain and source regions 157 and the surface of the isolation region 110 may be present, a corresponding patterning process may still be highly controllable due to the presence of the etch stop layer 160 so that the etch process for forming the trench of the power rail spine 175 may continue substantially without affecting the material 153 of the drain region 157 due to the high etch selectivity of the layer 160.

Thereafter, the etch stop layer 160 may be opened by a specifically designed etch process, wherein the material of the isolation region 110 and the metal semiconductor compound 153 may act as etch stop material. Thereafter, any barrier and/or adhesion layers may be deposited, such as titanium/titanium nitride, on the basis of well-established techniques and, subsequently, a highly conductive material, such as tungsten, may be deposited in accordance with well-established process strategies. Thereafter, any excess material may be removed by a planarization process, as also discussed above.

Figure 16:
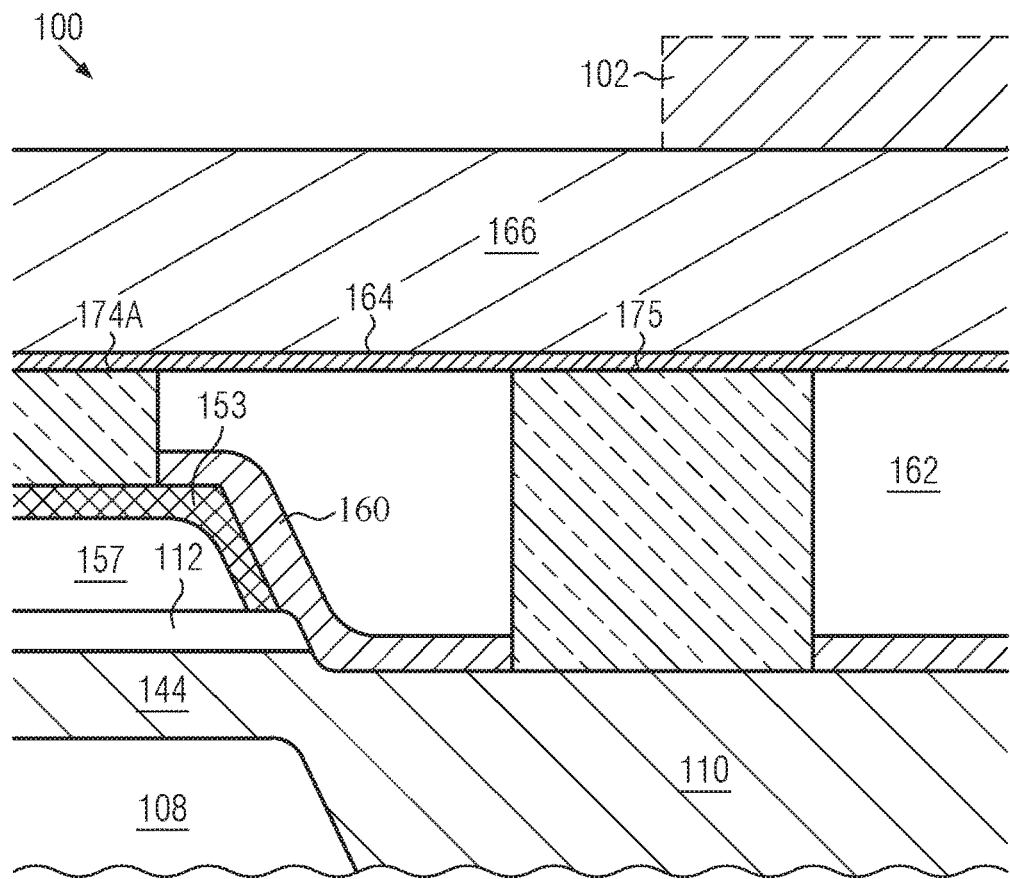

FIG. 16 schematically illustrates a cross-sectional view of the semiconductor device 100 in a further advanced manufacturing stage. As illustrated, an etch stop layer 164, such as a silicon nitride material, silicon oxynitride material and the like, may be formed on the dielectric material 162 and on the contact portion 174A and the power rail spine 175. To this end, any well-established deposition techniques may be applied. Furthermore, a further dielectric material 166, such as silicon dioxide and the like, or even materials with reduced dielectric constant, may be formed on the etch stop layer 164, possibly in combination with a planarization process, although basically superior process uniformity may be encountered due to the previously planarized surface topography upon forming the power rail spine 175 and the contact portion 174A. Next, a material stack may be provided and may be patterned so as to form an etch mask 102 that defines the lateral position, size and shape of the further portion of contact elements, such as lateral contact extension regions. To this end, any well-established process strategies may be applied, for instance in a similar manner as previously discussed in the context of FIGS. 1A-12.

Thereafter, an etch process may be applied so as to etch through the dielectric material 166, while using the etch stop layer 164 as an etch stop, which may subsequently be opened by a separate etch step, thereby avoiding undue exposure of the underlying conductive materials of the power rail spine 175 and the contact portion 174A. After the removal of the etch mask 102, a further process sequence for filling in an appropriate conductive material may be applied. For example, any adhesion/barrier layers may be deposited, followed by the deposition of a highly conductive material, such as tungsten and the like. Any excess material may subsequently be removed by planarization, as also discussed above.

Figure 17:
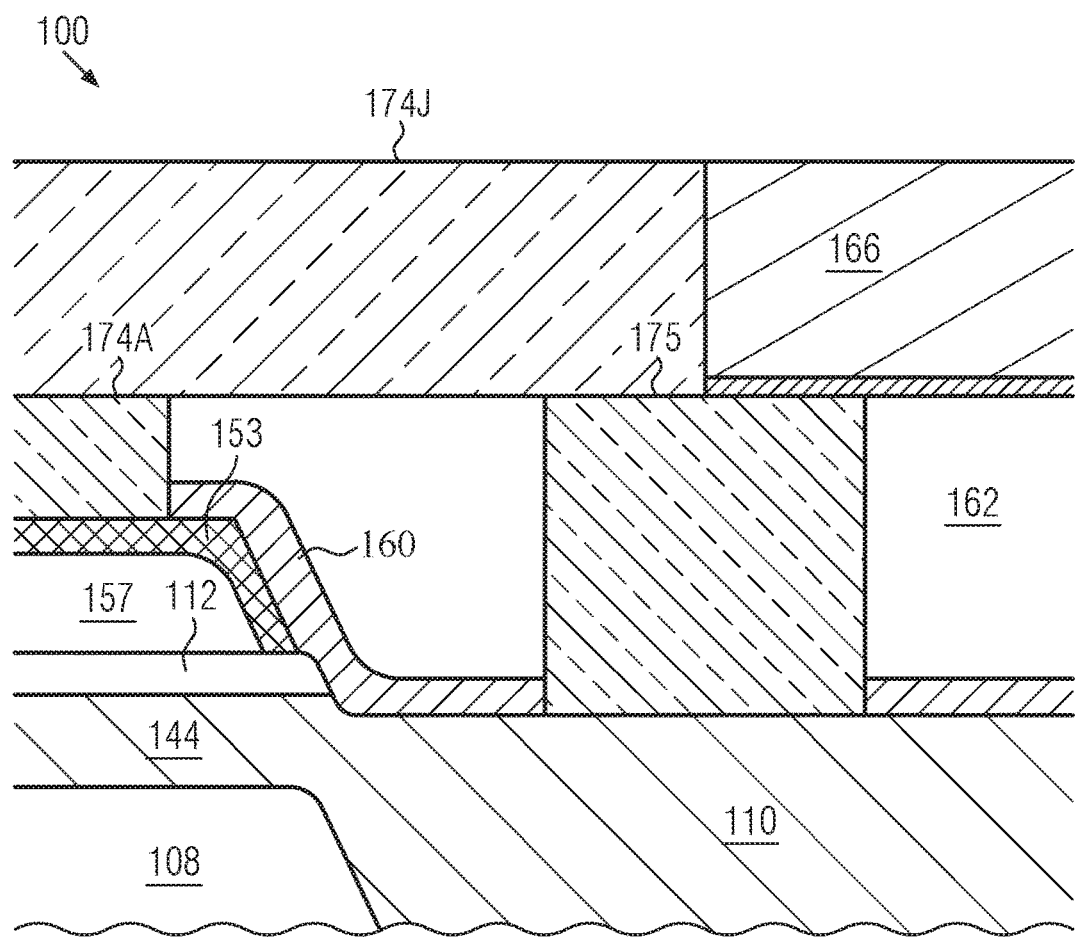

FIG. 17 schematically illustrates the semiconductor device 100 after completing the above-described process sequence. That is, the semiconductor device 100 may comprise a second or upper contact portion (not shown) for contact portions previously formed, such as the portion 174A, in device areas, in which the lateral contact extension regions may not be required. In the example shown, the lateral contact extension region 174J may be formed so as to connect to the power rail spine 175 and also to the contact portion 174A. It should be appreciated that the lateral contact extension region 174J may further extend into the active region 112 or in any other lateral direction, as required by the overall design and layout criteria.

It should be noted that, if compatible with overall design criteria, the lateral contact extension region 174J may also span across the entire surface of the power rail spine 175 so as to provide an increased contact area between the power rail spine 175 and the region 174J.

Figure 18:
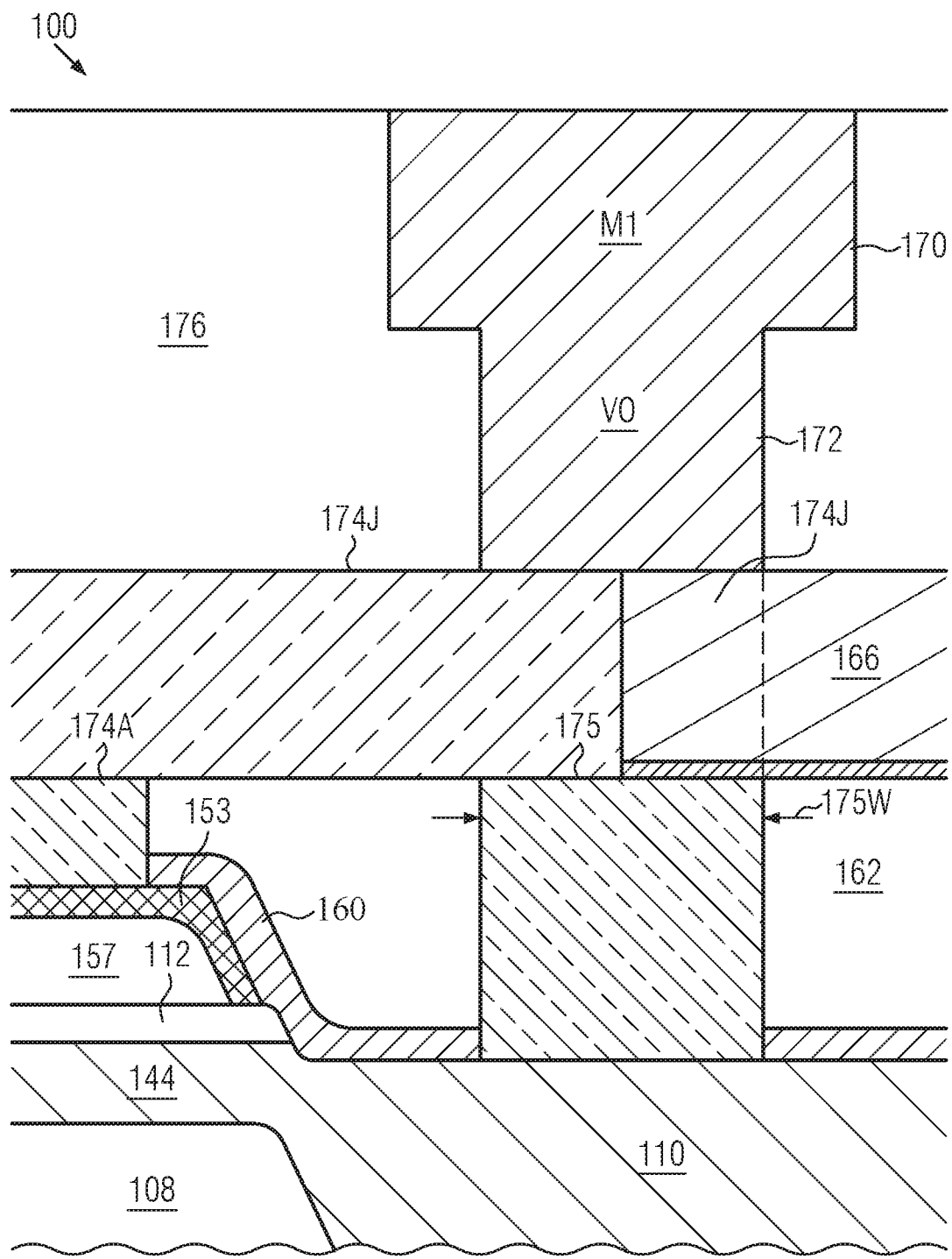

FIG. 18 schematically illustrates the semiconductor device 100 in a further advanced manufacturing stage. As illustrated, a first metallization layer includes metal lines indicated as M1, also including the power rail line 170 and the respective vias, such as V0, including the vias 172 connecting the power rail line 170 to the power rail spine 175. The metal lines and vias may be embedded in any appropriate dielectric material 176, such as hydrogen and carbon containing silicon dioxide (SiCOH), silicon dioxide material based on well-established precursor materials, such as TEOS, even low-k dielectric materials, for instance in the form of porous materials, and the like. The metal lines and vias of the first metallization layer and the dielectric material 176 may be formed on the basis of well-established process strategies, for instance as discussed above with reference to FIGS. 1A-12, wherein, in some illustrative embodiments, layout concepts and design rules may be applied so as to form the power rail line 170 with a width, as discussed above, for instance with a width corresponding to a design value of 40 nm and less, wherein the via 172 for connecting to the lower lying power rail spine 175 may be centered with respect to the power rail line 170, thereby also providing enhanced design flexibility.

As briefly discussed above, it should be appreciated that, in some illustrative embodiments, the lateral contact extension region 174J may be laterally extended so as to substantially fully span the width 175 W of the power rail spine 175, if considered appropriate. Furthermore, in some illustrative embodiment, the via 172 may not necessarily be positioned on the lateral contact extension region 174J but may be laterally shifted, i.e., in a direction perpendicular to the drawing plane of FIG. 18.

As a result, the two-level contact structure including a lower-level, i.e., the contact portion 174A and the power rail spine 175, and the upper level, such as the lateral contact extension region 174J, may provide superior design flexibility, thereby enabling a significant reduction of relevant features, while still avoiding the crossing of the interface between the active region and the isolation region in the lower level of the contact regime.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a short-hand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:
1. A method, comprising:
forming a plurality of transistor devices separated by shallow trench insulator regions, said plurality of transistor devices each comprising a substrate, a buried insulator layer positioned on said substrate, a semiconductor layer positioned on said buried insulator layer, a high-k metal gate stack positioned above said semiconductor layer and a gate electrode positioned above said high-k metal gate stack, raised source/drain regions positioned on said semiconductor layer, and a silicide contact layer positioned above said raised source/drain regions and said gate electrode;
forming an interlayer dielectric stack on said silicide contact layer and planarizing said interlayer dielectric stack;
patterning a plurality of contact openings through said interlayer dielectric stack that extend toward said raised source/drain regions; and
patterning lateral contact extension regions for at least some of said contact openings, said lateral contact extension regions extending over at least a portion of said shallow trench insulator regions neighboring corresponding raised source/drain regions, wherein patterning said plurality of contact openings and said lateral contact extension regions comprises performing two or more lithography and subsequent etching steps, and wherein said plurality of contact openings and/or said lateral contact extension regions are filled with organic dielectric layer material between performing said two or more steps of lithography and subsequent etching.

2. The method of claim 1, wherein patterning said plurality of contact openings through said interlayer dielectric stack comprises patterning vias through said interlayer dielectric stack, and wherein patterning said lateral contact extension regions comprises patterning trenches in said interlayer dielectric stack.

3. The method of claim 2, wherein patterning said trenches in said interlayer dielectric stack is performed after patterning said vias through said interlayer dielectric stack.

4. The method of claim 2, further comprising filling said vias and said trenches with a conductive material, wherein said conductive material comprises one of tungsten (W) or cobalt (Co).

5. The method of claim 2, further comprising depositing an oxide liner in said vias and/or said trenches.

6. The method of claim 2, wherein groups of vias and trenches are patterned sequentially.

7. The method of claim 1, further comprising forming a layer of dielectric material above said interlayer dielectric stack and patterning copper strip lines in said layer of dielectric material.

8. The method of claim 7, wherein said layer of dielectric material comprises at least one of amorphous silicon, SiCOH, Tetraethyl orthosilicate and ultra-low k material.

9. The method of claim 7, further comprising contacting one or more of said copper strip lines with laterally extended contact regions of said interlayer dielectric stack.

10. The method of claim 7, further comprising connecting said copper strip lines to at least one power rail.

11. The method of claim 1, further comprising, for at least a pair of laterally extended contact regions, forming a local interconnect between said laterally extended contact regions.

12. The method of claim 1, wherein forming said interlayer dielectric stack comprises forming at least two oxide layers and at least one stop layer between said two oxide layers, wherein said stop layer comprises silicon oxynitride or silicon nitride.

13. A method, comprising:
forming a power rail spine above a trench isolation region adjacent to an active region of a semiconductor device and at least a portion of a contact connecting to one of a drain region and a source region of a transistor device in a common process sequence, said power rail spline comprising a conductive material that is formed on and in contact with said trench isolation region; and
forming a lateral contact extension region extending above a portion of said trench isolation region so as to connect said lateral contact extension region to said power rail spine.

14. The method of claim 13, wherein said power rail spine is formed on the basis of a design width of 35 nm or less.

15. The method of claim 13, further comprising forming a conductive power line above said power rail spine by using a design width of 50 nm or less.

16. The method of claim 15, further comprising forming a conductive via element to conductively couple said power line to said power rail spline.

17. The method of claim 13, wherein said at least a portion of said contact and said power rail spine are formed in a first process sequence and said lateral contact extension region is formed in a second process sequence separate from said first process sequence.

18. A method, comprising:
forming first and second transistor devices above respective first and second active regions formed in a semiconductor layer and separated by a shallow trench isolation region, said first and second transistor devices each comprising raised source/drain regions formed above a respective active region;
forming an interlayer dielectric stack above said first and second transistor devices, said interlayer dielectric stack comprising a plurality of dielectric material layers;
forming a plurality of via openings through said interlayer dielectric stack, each of said plurality of via openings extending through each of said plurality of dielectric material layers of said interlayer dielectric stack and exposing one of said raised source/drain regions;
after forming said plurality of via openings that extend through each of said plurality of dielectric material layers of said interlayer dielectric stack and expose said raised source/drain regions, forming a lateral trench extension region in at least one but not all of said plurality of dielectric material layers of said interlayer dielectric stack, wherein said lateral extension trench extends between and connects a first via opening of said plurality of via openings and a second via opening of said plurality of via openings, and wherein said lateral trench extension region extends over but does not expose said shallow trench isolation region; and
forming a conductive material in each of said plurality of via openings and in said lateral trench extension region during a same material deposition sequence.

19. The method of claim 18, wherein said plurality of via openings are a first plurality of via openings and said first and second transistor devices each comprise a gate electrode structure, the method further comprising a second plurality of via openings, each of said second plurality of via openings exposing a respective gate electrode structure, wherein said conductive material is formed in each of said plurality of second via openings during said same material deposition sequence.

* * * * *